(12) United States Patent
Kashihara

(10) Patent No.: US 10,566,068 B2
(45) Date of Patent: Feb. 18, 2020

(54) SEMICONDUCTOR STORAGE DEVICE AND METHOD FOR CONTROLLING SEMICONDUCTOR STORAGE DEVICE

(71) Applicant: Renesas Electronics Corporation, Tokyo (JP)

(72) Inventor: Yoji Kashihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/048,392

(22) Filed: Jul. 30, 2018

(65) Prior Publication Data

US 2019/0088344 A1 Mar. 21, 2019

(30) Foreign Application Priority Data

Sep. 21, 2017 (JP) .................................. 2017-181448

(51) Int. Cl.

| | |
|---|---|
| *G11C 16/06* | (2006.01) |
| *G11C 16/34* | (2006.01) |
| *G11C 16/26* | (2006.01) |
| *G11C 16/14* | (2006.01) |
| *G11C 16/10* | (2006.01) |
| *G11C 16/04* | (2006.01) |

(52) U.S. Cl.
CPC ...... *G11C 16/3459* (2013.01); *G11C 16/0408* (2013.01); *G11C 16/10* (2013.01); *G11C 16/14* (2013.01); *G11C 16/26* (2013.01); *G11C 16/3445* (2013.01)

(58) Field of Classification Search
CPC . G11C 16/3459; G11C 16/0408; G11C 16/10; G11C 16/14; G11C 16/26; G11C 16/3445
See application file for complete search history.

(56) References Cited

U.S. PATENT DOCUMENTS

| | | | | |
|---|---|---|---|---|
| 5,886,927 A | * | 3/1999 | Takeuchi ........... | G11C 16/3436 365/185.2 |
| 6,163,484 A | * | 12/2000 | Uekubo ................. | G11C 16/28 365/185.2 |
| 6,891,756 B2 | | 5/2005 | Zink et al. | |
| | | | (Continued) | |

FOREIGN PATENT DOCUMENTS

| | | |
|---|---|---|
| EP | 0 600 151 A2 | 6/1994 |
| JP | 2004-318941 A | 11/2004 |

OTHER PUBLICATIONS

Extended European Search Report received in corresponding European Application No. 18186371.3 dated Jan. 31, 2019.

*Primary Examiner* — Pho M Luu
(74) *Attorney, Agent, or Firm* — Mattingly & Malur, PC

(57) ABSTRACT

To reduce a time required for verify processing of a semiconductor storage device, a semiconductor storage device according to one embodiment includes a plurality of unit memory arrays each including a plurality of memory blocks, a sense amplifier, and a verify circuit. When the semiconductor storage device performs verify processing, a pulse corresponding to verify data is applied to each memory cell of each memory block, and an expectation value corresponding to the verify data is set to each verify circuit. Each verify circuit performs the verify processing by comparing data stored read by the sense amplifier with the expectation value.

9 Claims, 14 Drawing Sheets

(56) References Cited

U.S. PATENT DOCUMENTS

| | | | |
|---|---|---|---|
| 7,190,615 B2 | 3/2007 | Fujito et al. | |
| 7,304,893 B1 * | 12/2007 | Hemink | G11C 16/12 |
| | | | 365/185.09 |
| 8,848,450 B2 * | 9/2014 | Kang | G11C 11/5628 |
| | | | 365/185.22 |

* cited by examiner

SEMICONDUCTOR STORAGE DEVICE AND METHOD FOR CONTROLLING SEMICONDUCTOR STORAGE DEVICE

CROSS-REFERENCE TO RELATED APPLICATIONS

The disclosure of Japanese Patent Application No. 2017-181448 filed on Sep. 21, 2017 including the specification, drawings and abstract is incorporated herein by reference in its entirety.

BACKGROUND

The present invention relates to a semiconductor storage device and a method for controlling the semiconductor storage device, and more particularly, to a semiconductor storage device having a verify function and a method for controlling the semiconductor storage device.

In recent years, many flash memories have been used as nonvolatile semiconductor storage devices. Such a flash memory performs verify processing to determine the correctness of a write operation and an erase operation. For example, in write verify processing, write data to a memory cell is an expectation value, read data obtained by reading data written in the memory cell is compared with the expectation value, and the correctness of the write operation is determined by the match or mismatch between the write data and the read data.

Japanese Unexamined Patent Publication No. 2004-318941 (Patent Document 1) discloses a technique related to a semiconductor storage device having a hierarchical bit line structure. In the semiconductor storage device disclosed in Patent Document 1, a memory array is divided, and bit lines have a hierarchical structure, thus making it possible to reduce the input load capacitance of a sense amplifier. Therefore, it is possible to enhance the reading speed of the semiconductor storage device.

SUMMARY

In the semiconductor storage device disclosed in Patent Document 1, one verify amplifier is provided separately from the sense amplifier. Further, the verify processing of each memory cell is performed using the one verify amplifier. The verify processing is performed in units of blocks; therefore, in the semiconductor storage device disclosed in Patent Document 1, the verify processing is performed in units of blocks in sequence (serially), using the one verify amplifier.

However, the memory capacity of the semiconductor storage device has been steadily increasing in recent years. Accordingly, in the case where the verify processing is performed in units of blocks in sequence as in the semiconductor storage device disclosed in Patent Document 1, there is a problem that much time is required for the verify processing.

The other problems and novel features will become apparent from the description of this specification and the accompanying drawings.

A semiconductor storage device according to one embodiment includes a plurality of unit memory arrays each including a plurality of memory blocks, a sense amplifier, and a verify circuit. When the semiconductor storage device performs verify processing, a pulse corresponding to verify data is applied to each memory cell of each memory block, and an expectation value corresponding to the verify data is set to each verify circuit. Each verify circuit performs the verify processing by comparing data stored read by the sense amplifier with the expectation value.

According to the one embodiment, it is possible to reduce the time required for the verify processing of the semiconductor storage device.

DETAILED DESCRIPTION

<Description of Semiconductor Device Using Semiconductor Storage Device>

Figure 1:
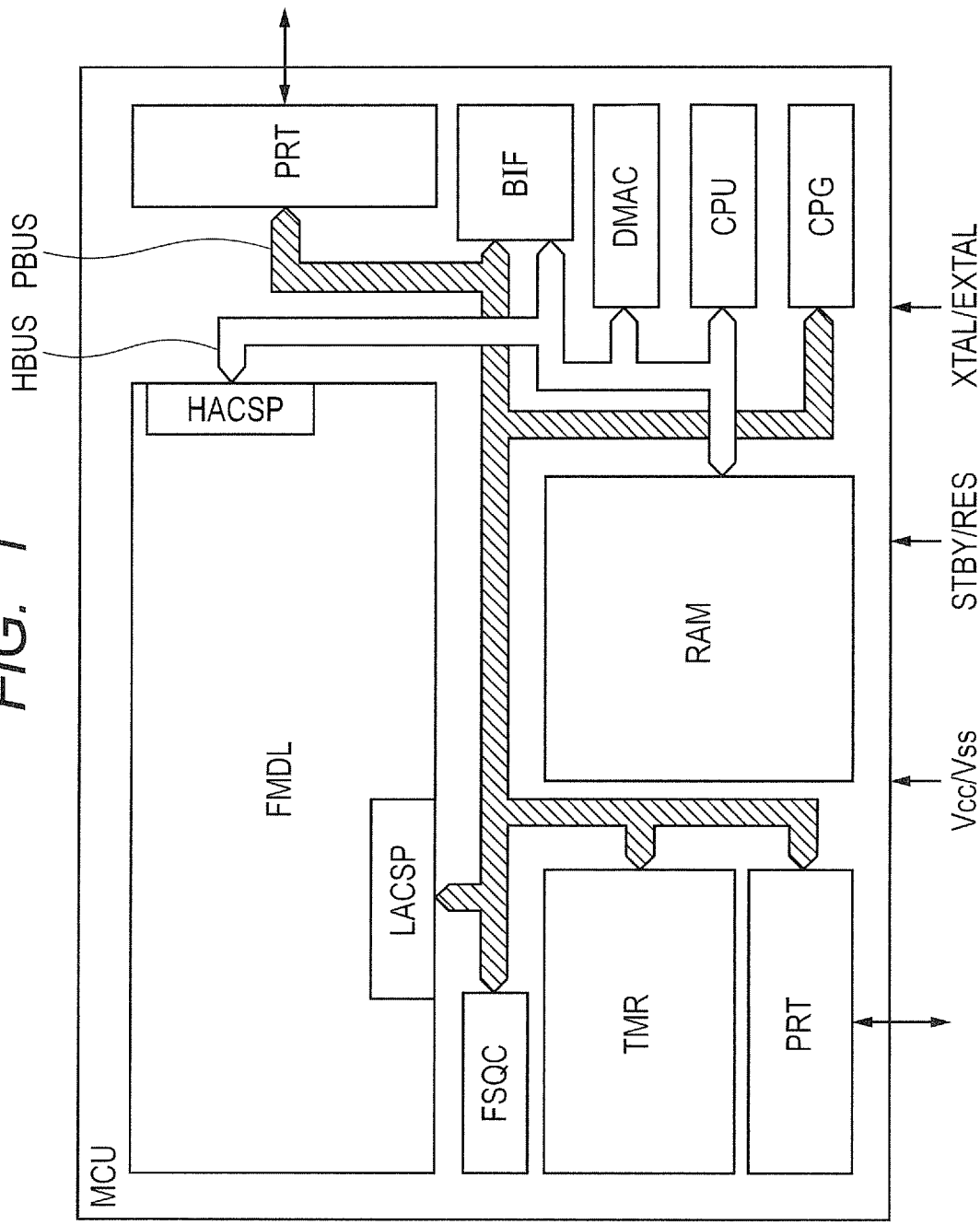
FIG. 1 is a block diagram showing an example of a semiconductor device using a semiconductor storage device according to embodiments.

First, an example of a semiconductor device using a semiconductor storage device according to embodiments will be described. FIG. 1 is a block diagram showing an example of the semiconductor device using the semiconductor storage device according to the embodiments. The semiconductor device shown in FIG. 1 is, for example, a microcomputer MCU.

The microcomputer MCU shown in FIG. 1 is formed over a single semiconductor chip made of e.g. monocrystalline silicon, using a CMOS (Complementary Metal Oxide Semiconductor) technology. As shown in FIG. 1, the microcomputer MCU includes a central processing unit CPU, a random access memory RAM, and a flash memory module FMDL. The central processing unit CPU includes an instruction control unit and an execution unit, and executes various instructions. The random access memory RAM is used as e.g. a work area of the central processing unit CPU. The flash memory module FMDL is provided as a nonvolatile memory module for storing data and programs.

The microcomputer MCU further includes a direct memory access controller DMAC, a bus interface circuit BIF, a flash sequencer FSQC, an external I/O port PRT, a timer TMR, a clock pulse generator CPG, a high-speed bus HBUS, and a peripheral bus PBUS.

The bus interface circuit BIF performs bus interface control or bus bridge control of the high-speed bus HBUS and the peripheral bus PBUS. The flash sequencer FSQC performs command access control on the flash memory module FMDL. The clock pulse generator CPG generates an internal clock CLK for controlling the microcomputer MCU.

Although the bus structure of the microcomputer MCU is not particularly limited; in FIG. 1, the high-speed bus HBUS and the peripheral bus PBUS are provided. Although not restricted, the high-speed bus HBUS and the peripheral bus PBUS each include a data bus, an address bus, and a control bus. By providing the two buses of the high-speed bus HBUS and the peripheral bus PBUS; as compared to the common coupling of all circuits to a common bus, it is possible to lighten the load on the bus and thereby ensure a high-speed access operation.

The central processing unit CPU, the direct memory access controller DMAC, the bus interface circuit BIF, the random access memory RAM, and the flash memory module FMDL are coupled to the high-speed bus HBUS. The flash sequencer FSQC, the external I/O port PRT, the timer TMR, and the clock pulse generator CPG are coupled to the peripheral bus PBUS.

The microcomputer MCU further includes a clock terminal XTAL/EXTAL to which an oscillator is coupled or an external clock is supplied, an external hardware standby terminal STBY for specifying a standby state, an external reset terminal RES for specifying reset, an external power source terminal Vcc, and an external ground terminal Vss.

While the flash sequencer FSQC as a logic circuit and the flash memory module FMDL having an array structure are designed using different CAD tools and therefore shown as separate circuit blocks in FIG. 1 for the sake of convenience, both the circuit blocks configure one flash memory.

The flash memory module FMDL is coupled to the high-speed bus HBUS through a read-only high-speed access port HACSP. The CPU or the DMAC can make read access to the flash memory module FMDL through the high-speed access port HACSP over the high-speed bus HBUS. The CPU or the DMAC issues a command to the flash sequencer FSQC through the bus interface BIF and the peripheral bus PBUS when making write access and initialization access to the flash memory module FMDL. In response to the command, the flash sequencer FSQC performs initialization control and write control on the flash memory module FMDL through a low-speed access port LACSP over the peripheral bus PBUS.

Semiconductor storage devices described below correspond to the flash memory module FMDL used in the semiconductor device (microcomputer MCU) shown in FIG. 1. Hereinafter, semiconductor storage devices according to first to third embodiments will be described.

First Embodiment

Figure 2:
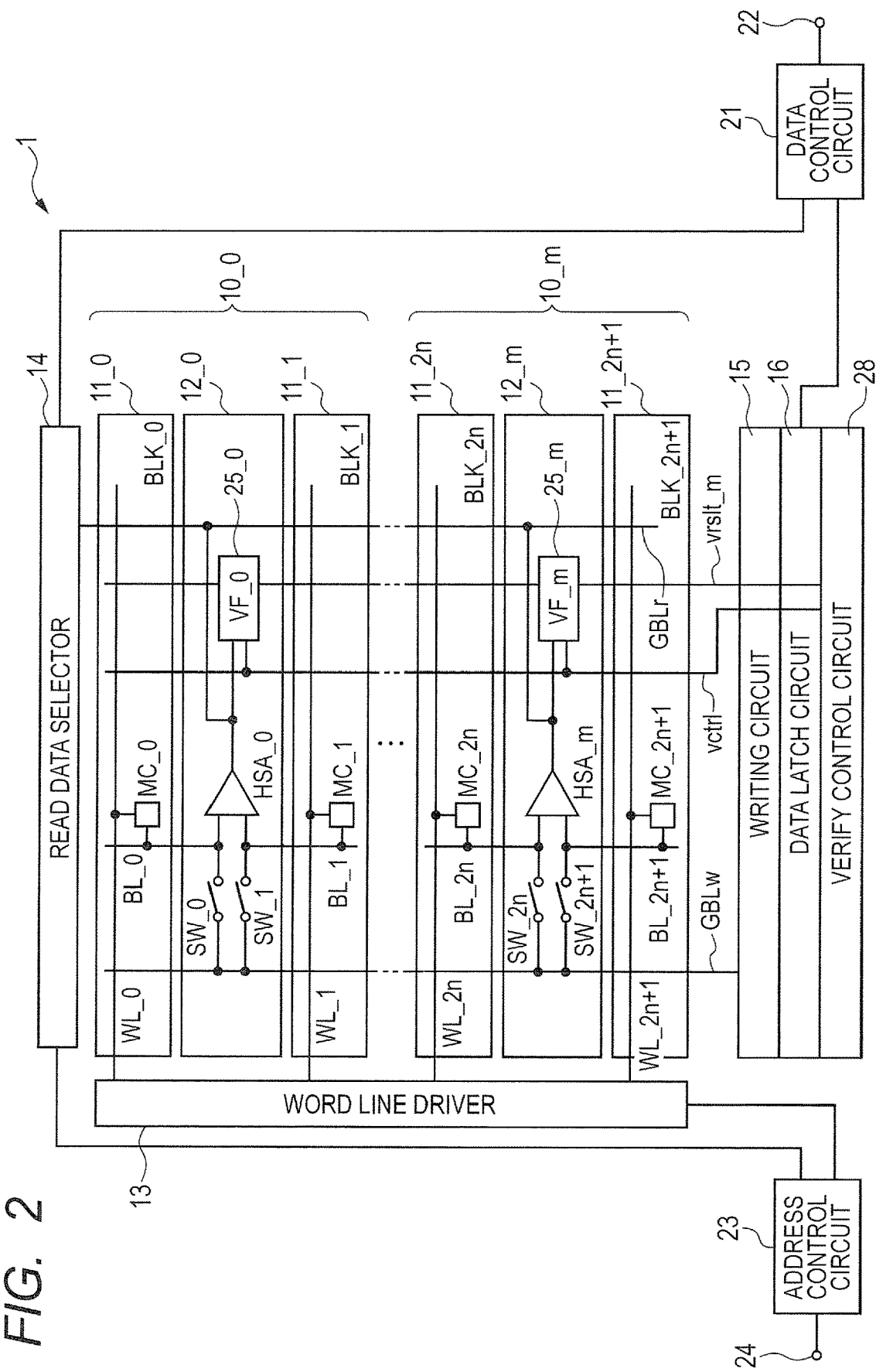
FIG. 2 is a diagram showing a semiconductor storage device according to a first embodiment.

Hereinafter, a semiconductor storage device and a method for controlling the semiconductor storage device according to a first embodiment will be described with reference to the drawings. FIG. 2 is a diagram showing the semiconductor storage device according to this embodiment. As shown in FIG. 2, the semiconductor storage device 1 according to this embodiment includes memory blocks 11_0 to 11_2n+1, sense amplifier blocks 12_0 to 12_m, a word line driver 13, a read data selector 14, a writing circuit 15, a data latch circuit 16, a data control circuit 21, an address control circuit 23, and a verify control circuit 28. In this context, n is an integer of 0 or more. Further, m is an integer of 0 or more. The integers n and m have the relation of m=n. The definitions of n and m also apply hereinafter in this specification. Further, in this specification, when constituent elements are generically called, they are described, for example, as "memory block 11" without using n, m.

For example, a pair of memory blocks 11_0, 11_1 (hereinafter also referred to as memory blocks BLK_0, BLK_1) and the sense amplifier block 12_0 configure a unit memory array 10_0. The sense amplifier block 12_0 is disposed between the memory block 11_0 (BLK_0) and the memory block 11_1 (BLK_1).

The memory block BLK_0 includes multiple memory cells MC_0. In FIG. 2, only one memory cell MC_0 is shown in one memory block BLK_0 for simplicity's sake. The same applies to the other memory blocks BLK_1 to 2n+1. The memory cell MC_0 is an electrically erasable/writable nonvolatile memory cell. The memory cell MC_0 is coupled to a word line WL_0 and a sub-bit line BL_0.

Similarly, the memory block BLK_1 includes multiple memory cells MC_1. The memory cell MC_1 is an electrically erasable/writable nonvolatile memory cell. The memory cell MC_1 is coupled to a word line WL_1 and a sub-bit line BL_1.

In this embodiment, the configuration of the memory cell MC_0, MC_1 includes, but is not limited to, for example, a stacked gate structure and a split gate structure. The stacked gate structure is a structure including a source, a drain, a channel, and a floating gate and a control gate which are stacked insulated from each other over the channel. The split gate structure is a structure including a source, a drain, a channel, and a selection gate and a memory gate which are adjacently formed insulated from each other over the channel.

The sense amplifier block 12_0 includes a sense amplifier HSA_0 and a verify circuit 25_0 (hereinafter also referred to as a verify circuit VF_0). The sense amplifier HSA_0 reads data stored in each memory cell MC_0, MC_1. The verify circuit VF_0 verifies data stored in each memory cell MC_0, MC_1.

The sub-bit line BL_0 of the memory block BLK_0 is coupled to one input terminal of the sense amplifier HSA_0. While one sub-bit line BL_0 is coupled to the one input terminal of the sense amplifier HSA_0 in the configuration shown in FIG. 2 for the sake of convenience, multiple sub-bit lines BL_0 are selectively coupled to the one input terminal of the sense amplifier HSA_0 in this embodiment. For example, a column selection circuit (not shown) is provided between the one input terminal of the sense amplifier HSA_0 and the multiple sub-bit lines BL_0. By using the column selection circuit, it is possible to selectively couple one sub-bit line BL_0 among the multiple sub-bit lines BL_0 to the one input terminal of the sense amplifier HSA_0.

The sub-bit line BL_1 of the memory block BLK_1 is coupled to the other input terminal of the sense amplifier HSA_0. While one sub-bit line BL_1 is coupled to the other input terminal of the sense amplifier HSA_0 in the configuration shown in FIG. 2 for the sake of convenience, multiple sub-bit lines BL_1 are selectively coupled to the other input terminal of the sense amplifier HSA_0 in this embodiment. For example, a column selection circuit (not shown) is provided between the other input terminal of the sense amplifier HSA_0 and the multiple sub-bit lines BL_1. By using the column selection circuit, it is possible to selectively couple one sub-bit line BL_1 among the multiple sub-bit lines BL_1 to the other input terminal of the sense amplifier HSA_0.

For example, when data stored in the memory cell MC_0 is read, the one input terminal of the sense amplifier HSA_0 is coupled to the sub-bit line BL_0, and the other input terminal is coupled to a reference. Based on the potential difference between this sub-bit line BL_0 and the reference, the sense amplifier HSA_0 reads the data stored in the memory cell MC_0. The output terminal of the sense amplifier HSA_0 is coupled to a readout main bit line GBLr, and read data outputted from the sense amplifier HSA_0 is supplied to the read data selector 14 through the readout main bit line GBLr.

Further, the output terminal of the sense amplifier HSA_0 is coupled to the verify circuit VF_0. The verify circuit VF_0 performs verify processing by comparing the data stored in the memory cell MC_0 and read by the sense amplifier HSA_0 with an expectation value vctrl. The expectation value vctrl is a value set to the verify circuit VF_0, using the verify control circuit 28. The details of the verify circuit VF_0 will be described later.

In FIG. 2, one sense amplifier HSA_0 and one verify circuit VF_0 are shown in one sense amplifier block 12_0 for simplicity's sake. However, in the semiconductor storage device according to this embodiment, multiple combinations of the sense amplifier HSA_0 and the verify circuit VF_0 are provided in one sense amplifier block 12_0, and the number of combinations of the sense amplifier HSA_0 and the verify circuit VF_0 increases as the number of memory cells MC_0, MC_1 in the memory blocks BLK_0, BLK_1 increases.

While the configuration of the unit memory array 10_0 including a pair of memory blocks 11_0, 11_1 (BLK_0, BLK_1) and the sense amplifier block 12_0 has been described, the same applies to the configuration of the other unit memory arrays 10_1 to 10_m.

The writing circuit 15 generates data to be written to each memory cell MC_0 to MC_2n+1. The write data generated by the writing circuit 15 is delivered to each memory block BLK_0 to BLK_2n+1 through the use of a writing main bit line GBLw. The sub-bit line BL_0 to BL_2n+1 of each memory blocks BLK_0 to BLK_2n+1 is coupled to the writing main bit line GBLw through each switch SW_0 to SW_2n+1. That is, the write data delivered through the writing main bit line GBLw is selectively delivered to the sub-bit line BL_0 to BL_2n+1 by the on/off control of each switch SW_0 to SW_2n+1.

Thus, the semiconductor storage device according to this embodiment has a hierarchical bit line structure, and the write data delivered through the writing main bit line GBLw is selectively delivered to the memory cell MC_0 to MC_2n+1 to which the write data is to be written by the on/off control of the switch SW_0 to SW_2n+1. When the write data is written to any one of the memory cells MC_0 to MC_2n+1, the word line WL_0 to WL_2n+1 coupled to the memory cell MC_0 to MC_2n+1 to which the write data is to be written is activated.

For example, when the write data generated by the writing circuit 15 is written to the memory cell MC_0, the switch SW_0 is turned on, and the switches SW_1 to SW_2n+1 are turned off. Thereby, the writing main bit line GBLw is coupled to the sub-bit line BL_0 of the memory block BLK_0. Further, the word line WL_0 coupled to the memory cell MC_0 is activated.

Further, since the semiconductor storage device according to this embodiment has the hierarchical bit line structure, each sense amplifier HSA_0 to HSA_m can operate at high speed. That is, in the semiconductor storage device according to this embodiment, the memory array is divided into multiple memory blocks 11, and the sub-bit line BL is provided for each of the divided memory blocks 11. Each sub-bit line BL is coupled to the common writing main bit line GBLw through the switch SW. Therefore, each sense amplifier HSA_0 to HSA_m can sense only the sub-bit line BL of light load, and therefore operate at high speed.

Write data is supplied to the data control circuit 21 through a data input/output terminal 22. The write data supplied to the data control circuit 21 is supplied to the data latch circuit 16. The data latch circuit 16 temporarily latches the write data sequentially supplied from the data control circuit 21, and then supplies the write data to the writing circuit 15.

Further, read data is supplied from the read data selector 14 to the data control circuit 21. The read data supplied from the read data selector 14 is outputted to the outside through the data input/output terminal 22.

An address signal is supplied to the address control circuit 23 through an address input terminal 24. The address signal supplied to the address control circuit 23 is supplied to the word line driver 13 and the read data selector 14. The word line driver 13 activates the word line WL_0 to WL_2n+1 corresponding to the address signal supplied from the address control circuit 23. Thereby, the memory cell MC_0 to MC_2n+1 corresponding to the address signal supplied from the address control circuit 23 is selected.

Further, the read data selector 14 outputs, to the data control circuit 21, read data corresponding to the address signal supplied from the address control circuit 23. That is, multiple readout main bit lines GBLr are coupled to the read data selector 14, and the read data selector 14 selects the readout main bit line GBLr corresponding to the address signal supplied from the address control circuit 23 among the multiple readout main bit lines GBLr, and outputs the read data of the selected readout main bit line GBLr to the data control circuit 21.

Next, the verify circuit 25_0 to 25_m (hereinafter also referred to as the verify circuit VF_0 to VF_m) shown in FIG. 2 will be described in detail. Each verify circuit VF_0 to VF_m performs verify processing by comparing the data of the memory cell MC_0 to MC_2n+1 read by each sense amplifier HSA_0 to HSA_m with the expectation value. The verify control circuit 28 controls the verify processing in each verify circuit VF_0 to VF_m.

More specifically, when the verify processing is performed on the memory cell MC_0 of the memory block BLK_0, the verify control circuit 28 applies a pulse corresponding to verify data to write the verify data to the memory cell MC_0, using the writing circuit 15. Further, the verify control circuit 28 sets the expectation value corresponding to the verify data to the verify circuit VF_0. The verify data is erase verify data or write verify data.

For example, in the case where the erase verify data is stored in the memory cell MC_0 of the memory block BLK_0, the expectation value of the output of the sense amplifier HSA_0 is a high level ("H"). In this case, the verify control circuit 28 sets the high level ("H") as the expectation value corresponding to the verify data to the verify circuit VF_0.

Then, the one input terminal of the sense amplifier HSA_0 is coupled to the sub-bit line BL_0, the other input terminal is coupled to the reference, and the erase verify data stored in the memory cell MC_0 is read. Then, when the output of the sense amplifier HSA_0 matches the set expectation value (high level "H"), that is, when the output of the sense amplifier HSA_0 is at the high level ("H"), the verify circuit VF_0 determines that the verify processing is normal. On the other hand, when the output of the sense amplifier HSA_0 does not match the set expectation value (high level "H"), that is, when the output of the sense amplifier HSA_0 is at a low level ("L"), the verify circuit VF_0 determines that the verify processing is abnormal.

In the case where the write verify data is stored in the memory cell MC_0 of the memory block BLK_0, the expectation value of the output of the sense amplifier HSA_0 is the low level ("L"). In this case, the verify control circuit 28 sets the low level ("L") as the expectation value corresponding to the verify data to the verify circuit VF_0. The other operations are the same as the operations of the verify processing using the erase verify data described above.

Further, when the verify processing is performed on the memory cell MC_1 of the memory block BLK_1, the verify control circuit 28 applies a pulse corresponding to verify data to write the verify data to the memory cell MC_1, using the writing circuit 15. Further, the verify control circuit 28 sets the expectation value corresponding to the verify data to the verify circuit VF_0.

For example, in the case where the erase verify data is stored in the memory cell MC_1 of the memory block BLK_1, the expectation value of the output of the sense amplifier HSA_0 is the high level ("H"). In this case, the verify control circuit 28 sets the high level ("H") as the expectation value corresponding to the verify data to the verify circuit VF_0.

Then, the one input terminal of the sense amplifier HSA_0 is coupled to the reference, the other input terminal is coupled to the sub-bit line BL_1, and the erase verify data stored in the memory cell MC_1 is read. Then, when the output of the sense amplifier HSA_0 matches the set expectation value (high level "H"), that is, when the output of the sense amplifier HSA_0 is at the high level ("H"), the verify circuit VF_0 determines that the verify processing is normal. On the other hand, when the output of the sense amplifier HSA_0 does not match the set expectation value (high level "H"), that is, when the output of the sense amplifier HSA_0 is at the low level ("L"), the verify circuit VF_0 determines that the verify processing is abnormal.

On the other hand, in the case where the write verify data is stored in the memory cell MC_1 of the memory block BLK_1, the expectation value of the output of the sense amplifier HSA_0 is the low level ("L"). In this case, the verify control circuit 28 sets the low level ("L") as the expectation value corresponding to the verify data to the verify circuit VF_0. The other operations are the same as the operations of the verify processing using the erase verify data described above.

Since the sense amplifier HSA_0 and the verify circuit VF_0 are shared between the two memory blocks BLK_0, BLK_1, the verify processing cannot be performed on the two memory blocks BLK_0, BLK_1 at the same time. Therefore, in the semiconductor storage device 1 according to this embodiment, the verify processing is performed on even-numbered memory blocks BLK_0, BLK_2, ..., BLK_2n and odd-numbered memory blocks BLK_1, BLK_3, ..., BLK_2n+1 at different timings (n is an integer of 0 or more).

For example, the verify processing may be performed on the even-numbered memory blocks BLK_0, BLK_2, ..., BLK_2n, and then performed on the odd-numbered memory blocks BLK_1, BLK_3, ..., BLK_2n+1. On the contrary, the verify processing may be performed on the odd-numbered memory blocks BLK_1, BLK_3, ..., BLK_2n+1, and then performed on the even-numbered memory blocks BLK_0, BLK_2, ..., BLK_2n.

Further, for example, in the semiconductor storage device 1 according to this embodiment, since the verify processing is performed on all memory cells MC_0 included in the memory block BLK_0, the same verify data is written to all the memory cells MC_0 included in the memory block BLK_0.

For example, when the erase verify data is written to the memory cell MC_0 included in the memory block BLK_0, the erase verify data is written to all the memory cells MC_0 of the memory block BLK_0. When the write verify data is written to the memory cell MC_0 included in the memory block BLK_0, the write verify data is written to all the memory cells MC_0 of the memory block BLK_0. The same applies to the other memory cells MC_1 to MC_2n+1 included in the memory blocks BLK_1 to BLK_2n+1.

The result of the verify processing in each verify circuit VF_0 to VF_m is supplied to the verify control circuit 28. In the configuration shown in FIG. 2, each verify circuit VF_0 to VF_m sequentially (successively) transmits the result of the verify processing in each verify circuit VF_0 to VF_m to the verify control circuit 28. In this configuration, when the results of the verify processing in all the verify circuits VF_0 to VF_m are normal, the final-stage verify circuit VF_m supplies a verify result vrslt_m indicating normality to the verify control circuit 28. In other words, when it is determined that the result of the verify processing is abnormal in at least one of the verify circuits VF_0 to VF_m, the final-stage verify circuit VF_m supplies a verify result vrslt_m indicating abnormality to the verify control circuit 28.

Figure 3:
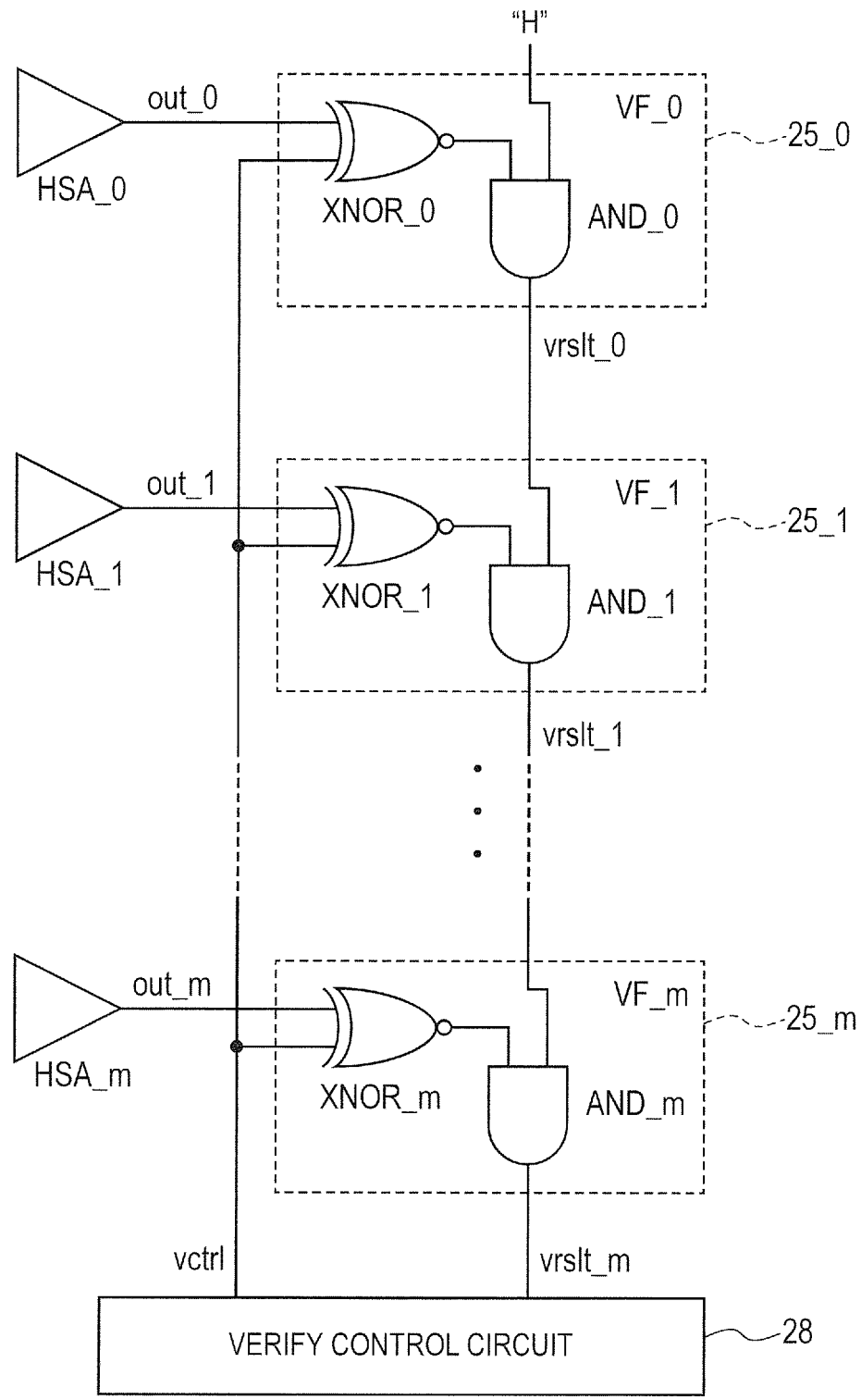
FIG. 3 is a circuit diagram showing an example of each verify circuit included in the semiconductor storage device according to the first embodiment.

FIG. 3 is a circuit diagram showing an example of each verify circuit included in the semiconductor storage device according to this embodiment. As shown in FIG. 3, the verify circuits 25_0 to 25_m (VF_0 to VF_m) include logic circuits XNOR_0 to XNOR_m and logic circuits AND_0 to AND_m, respectively.

Each logic circuit XNOR_0 to XNOR_m compares the data of the memory cell read by each sense amplifier HSA_0 to HSA_m with the expectation value vctrl supplied from the verify control circuit 28, and outputs the comparison result as the result of the verify processing. That is, each logic circuit XNOR_0 to XNOR_m inputs the output out_0 to out_m of each sense amplifier HSA_0 to HSA_m and the expectation value vctrl supplied from the verify control circuit 28, and supplies the XNOR (negation of exclusive OR) to one input of each logic circuit AND_0 to AND_m. The expectation value vctrl supplied from the verify control circuit 28 is common to all the verify circuits VF_0 to VF_m.

Each logic circuit AND_0 to AND_m inputs the output of each logic circuit XNOR_0 to XNOR_m and the result of the verify processing in the preceding stage (since the verify circuit 25_0 is the first-stage circuit, "H" is set as an initial value), and outputs a signal indicating normality when the output of the logic circuit XNOR_0 to XNOR_m and the result of the verify processing in the preceding stage are both normal.

As shown in FIG. 3, the verify circuits VF_0 to VF_m are sequentially coupled to each other. More specifically, since the logic circuits AND_0 to AND_m are sequentially coupled to each other; when the outputs of all the logic circuits XNOR_0 to XNOR_m are at the high level (indicating normality), the outputs vrslt_0 to vrslt_m of all the logic circuits AND_0 to AND_m are at the high level (indicating normality), and the signal of the high level as the verify result vrslt_m is supplied to the verify control circuit 28.

Next, specific operations of each verify circuit VF_0 to VF_m will be described. First, an operation in the case of the erase verify will be described. In the case of the erase verify, since the erase verify data is stored in the memory cell MC_0 to MC_$2n$+1 of each memory block BLK_0 to BLK_$2n$+1, the expectation value of the output of each sense amplifier HSA_0 to HSA_m is the high level ("H"). In this case, the verify control circuit 28 sets the high level ("H") as the expectation value vctrl to each verify circuit VF_0 to VF_m.

When the memory cells subjected to the verify processing are normal, the output of each sense amplifier HSA_0 to HSA_m is at the high level ("H"), so that the signal of the high level ("H") is supplied to one input of each logic circuit XNOR_0 to XNOR_m. Further, since the signal of the high level ("H") as the expectation value vctrl is supplied to the other input of each logic circuit XNOR_0 to XNOR_m, each logic circuit XNOR_0 to XNOR_m supplies the signal of the high level ("H") as the result of the verify processing to the one input of each logic circuit AND_0 to AND_m.

Further, since the signal of the high level ("H") is supplied to the other input of the logic circuit AND_0 of the first-stage verify circuit VF_0, the logic circuit AND_0 supplies the verify result vrslt_0 of the high level ("H") to the other input of the next-stage logic circuit AND_1. Further, the signal of the high level ("H") is supplied from the logic circuit XNOR_1 to the one input of the logic circuit AND_1 of the verify circuit VF_1, and the verify result vrslt_0 of the high level ("H") is supplied from the preceding-stage logic circuit AND_0 to the other input. Therefore, the logic circuit AND_1 supplies the verify result vrslt_1 of the high level ("H") to the other input of the next-stage logic circuit AND_2.

Thus, when the memory cells subjected to the verify processing are all normal, the signal outputted from each logic circuit XNOR_0 to XNOR_m is at the high level ("H"), so that each logic circuit AND_0 to AND_m outputs the signal of the high level ("H") as the verify result vrslt_0 to vrslt_m to the next stage. Therefore, the verify result vrslt_m of the high level ("H") is supplied to the verify control circuit 28.

On the other hand, when at least one of the memory cells subjected to the verify processing is abnormal, the output of at least one of the sense amplifiers HSA_0 to HSA_m is at the low level ("L"). In this case, since the output of the sense amplifier does not match the expectation value, the output of at least one of the logic circuits XNOR_0 to XNOR_m is at the low level ("L"). Therefore, the logic circuit AND_0 to AND_m supplied with the signal of the low level ("L") among the logic circuits AND_0 to AND_m outputs the signal of the low level ("L") as the verify result vrslt_0 to vrslt_m, so that the outputs of the subsequent logic circuits AND are at the low level ("L"). Therefore, the verify result vrslt_m of the low level ("L") is supplied to the verify control circuit 28.

Next, an operation in the case of the write verify will be described. In the case of the write verify, since the write verify data is stored in the memory cell MC_0 to MC_$2n$+1 of each memory block BLK_0 to BLK_$2n$+1, the expectation value of the output of each sense amplifier HSA_0 to HSA_m is the low level ("L"). In this case, the verify control circuit 28 sets the low level ("L") as the expectation value vctrl to each verify circuit VF_0 to VF_m.

When the memory cells subjected to the verify processing are all normal, the output of each sense amplifier HSA_0 to HSA_m is at the low level ("L"), so that the signal of the low level ("L") is supplied to the one input of each logic circuit XNOR_0 to XNOR_m. Further, since the signal of the low level ("L") as the expectation value vctrl is supplied to the other input of each logic circuit XNOR_0 to XNOR_m, each logic circuit XNOR_0 to XNOR_m supplies the signal of the high level ("H") as the result of the verify processing to the one input of each logic circuit AND_0 to AND_m.

Further, since the signal of the high level ("H") is supplied to the other input of the logic circuit AND_0 of the first-stage verify circuit VF_0, the logic circuit AND_0 supplies the verify result vrslt_0 of the high level ("H") to the other input of the next-stage logic circuit AND_1. Further, the signal of the high level ("H") is supplied from the logic circuit XNOR_1 to the one input of the logic circuit AND_1 of the verify circuit VF_1, and the verify result vrslt_0 of the high level ("H") is supplied from the preceding-stage logic circuit AND_0 to the other input. Therefore, the logic circuit AND_1 supplies the verify result vrslt_1 of the high level ("H") to the other input of the next-stage logic circuit AND_2.

Thus, when the memory cells subjected to the verify processing are all normal, the signal outputted from each logic circuit XNOR_0 to XNOR_m is at the high level ("H"), so that each logic circuit AND_0 to AND_m outputs the verify result vrslt_0 to vrslt_m of the high level ("H") to the next stage. Therefore, the verify result vrslt_m of the high level ("H") is supplied to the verify control circuit 28.

On the other hand, when at least one of the memory cells subjected to the verify processing is abnormal, the output of at least one of the sense amplifiers HSA_0 to HSA_m is at the high level ("H"). In this case, since the output of the sense amplifier does not match the expectation value, the output of at least one of the logic circuits XNOR_0 to XNOR_m is at the low level ("L"). Therefore, the logic circuit AND_0 to AND_m supplied with the signal of the low level ("L") among the logic circuits AND_0 to AND_m outputs the signal of the low level ("L") as the verify result vrslt_0 to vrslt_m, so that the outputs of the subsequent logic circuits AND are at the low level ("L"). Therefore, the verify result vrslt_m of the low level ("L") is supplied to the verify control circuit 28.

By the operations described above, when the verify result vrslt_m supplied to the verify control circuit 28 is at the high level ("H"), it is determined that the memory cells subjected to the verify processing are all normal (verify pass). On the other hand, when the verify result vrslt_m supplied to the verify control circuit 28 is at the low level ("L"), it is determined that at least one of the memory cells subjected to the verify processing is abnormal (verify fail). Thus, in the semiconductor storage device according to this embodiment, it is possible to perform the verify processing of multiple memory blocks BLK at the same time.

Next, the flow of the verify processing in the semiconductor storage device according to this embodiment (the method for controlling the semiconductor storage device) will be described with reference to flowcharts shown in FIGS. 4 to 6. The flow of the verify processing described below is common to the erase verify and the write verify.

As shown in FIG. 2, in the semiconductor storage device 1 according to this embodiment, two memory blocks BLK (11) are provided with one sense amplifier block 12. Therefore, when the verify processing is performed in each unit memory array 10, it is necessary to perform the verify processing on the even-numbered memory block and on the odd-numbered memory block at two separate timings.

First, the flow of verify processing (first pattern) will be described with reference to the flowchart shown in FIG. 4. In the verify processing of the first pattern, first, the verify control circuit 28 applies a pulse corresponding to verify data to the memory cells of the memory blocks BLK_0 to BLK_2n+1 (step S1). The pulse corresponding to verify data is a pulse voltage for writing the erase verify data or a pulse voltage for writing the write verify data to the memory cells of the memory blocks BLK_0 to BLK_2n+1. The pulse corresponding to the verify data may be applied to the memory blocks BLK_0 to BLK_2n+1 in sequence, or may be applied to the memory blocks BLK_0 to BLK_2n+1 at a time.

Then, the verify circuits VF_0 to VF_m perform the verify processing on the even-numbered memory blocks BLK_0, BLK_2, ..., BLK_2n (step S2). More specifically, each verify circuit VF_0 to VF_m compares the verify data (erase verify data or write verify data) stored in the memory cell MC with the expectation value, and determines that the verify processing is normal (verify pass) when the verify data matches the expectation value. On the other hand, when the verify data does not match the expectation value, it is determined that the verify processing is abnormal (verify fail).

When it is determined that the verify processing is abnormal (verify fail) in at least one of the even-numbered memory blocks BLK_0, BLK_2, ..., BLK_2n (step S3: No), steps S1 to S2 are repeated.

On the other hand, when it is determined that the verify processing is normal (verify pass) in all of the even-numbered memory blocks BLK_0, BLK_2, ..., BLK_2n (step S3: Yes), the verify circuits VF_0 to VF_m perform the verify processing on the odd-numbered memory blocks BLK_1, BLK_3, ..., BLK_2n+1 (step S4). More specifically, each verify circuit VF_0 to VF_m compares the verify data (erase verify data or write verify data) stored in the memory cell MC with the expectation value, and determines that the verify processing is normal (verify pass) when the both match each other. On the other hand, when the both do not match each other, it is determined that the verify processing is abnormal (verify fail).

When it is determined that the verify processing is abnormal (verify fail) in at least one of the odd-numbered memory blocks BLK_1, BLK_3, ..., BLK_2n+1 (step S5: No), steps S1 to S4 are repeated. On the other hand, when it is determined that the verify processing is normal (verify pass) in all of the odd-numbered memory blocks BLK_1, BLK_3, ..., BLK_2n+1 (step S5: Yes), the verify processing of the semiconductor storage device is normal, and the verify processing is ended.

Next, the flow of verify processing (second pattern) will be described with reference to the flowchart shown in FIG. 5. In the verify processing of the second pattern, first, the verify control circuit 28 applies a pulse corresponding to verify data to the memory cells of the memory blocks BLK_0 to BLK_2n+1 (step S11). The pulse corresponding to verify data is a pulse voltage for writing the erase verify data or a pulse voltage for writing the write verify data to the memory cells of the memory blocks BLK_0 to BLK_2n+1. The pulse corresponding to the verify data may be applied to the memory blocks BLK_0 to BLK_2n+1 in sequence, or may be applied to the memory blocks BLK_0 to BLK_2n+1 at a time.

Then, the verify circuits VF_0 to VF_m perform the verify processing on the even-numbered memory blocks BLK_0, BLK_2, ..., BLK_2n (step S12). More specifically, each verify circuit VF_0 to VF_m compares the verify data (erase verify data or write verify data) stored in the memory cell MC with the expectation value, and determines that the verify processing is normal (verify pass) when the verify data matches the expectation value. On the other hand, when the verify data does not match the expectation value, it is determined that the verify processing is abnormal (verify fail).

Then, the verify circuits VF_0 to VF_m perform the verify processing on the odd-numbered memory blocks BLK_1, BLK_3, ..., BLK_2n+1 (step S13). More specifically, each verify circuit VF_0 to VF_m compares the verify data (erase verify data or write verify data) stored in the memory cell MC with the expectation value, and determines that the verify processing is normal (verify pass) when the verify data matches the expectation value. On the other hand, when the verify data does not match the expectation value, it is determined that the verify processing is abnormal (verify fail).

When it is determined that the verify processing is abnormal (verify fail) in at least one of the memory blocks BLK_0 to BLK_2n+1 (step S14: No), steps S11 to S13 are repeated. On the other hand, when it is determined that the verify processing is normal (verify pass) in all of the memory blocks BLK_0 to BLK_2n+1 (step S14: Yes), the verify processing of the semiconductor storage device is normal, and the verify processing is ended.

Figure 4:
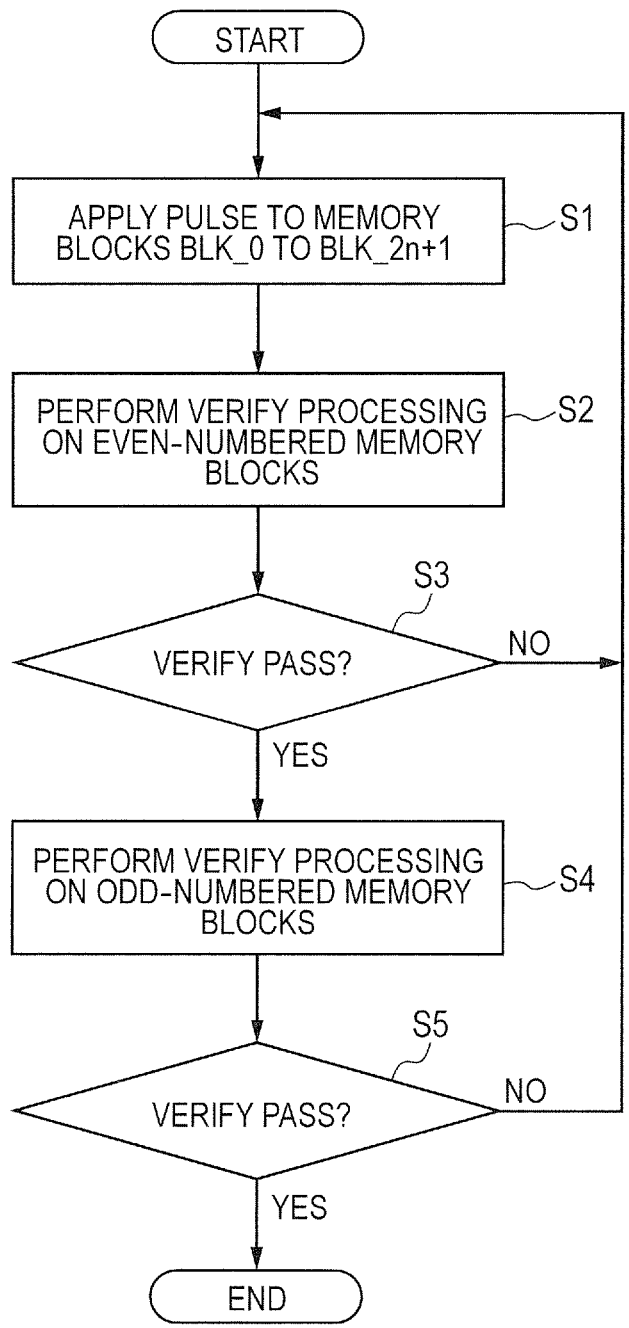
FIG. 4 is a flowchart for explaining an example of verify processing in the semiconductor storage device according to the first embodiment.

In the verify processing shown in FIG. 4, after it is determined that the verify processing of the even-numbered memory blocks is normal, the verify processing of the odd-numbered memory blocks is performed. In the verify processing shown in FIG. 4, since the pulse corresponding to the verify data is applied to all the memory blocks BLK_0 to BLK_2n+1 (step S1); for example when it is determined that the verify processing of the odd-numbered memory blocks is abnormal after it is determined that the verify processing of the even-numbered memory blocks is normal, the extra pulse is applied to the even-numbered memory blocks as a result.

Figure 5:
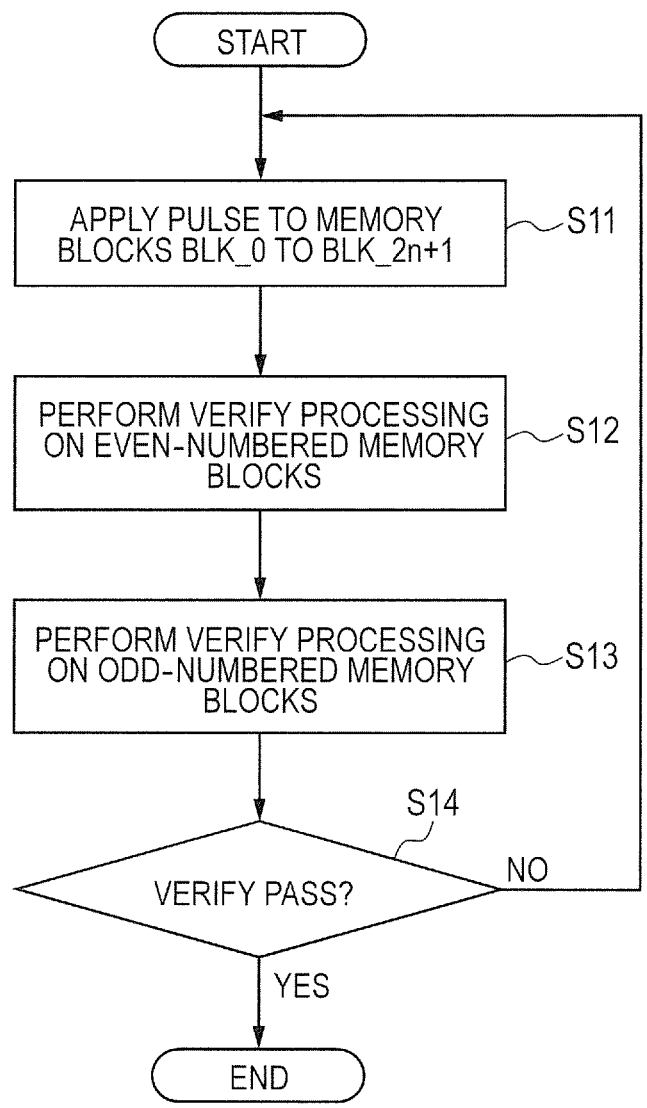
FIG. 5 is a flowchart for explaining an example of verify processing in the semiconductor storage device according to the first embodiment.

On the other hand, in the verify processing shown in FIG. 5, since the result of the verify processing of the even-numbered memory blocks and the result of the verify processing of the odd-numbered memory blocks are collectively determined (see step S14), it is possible to suppress the application of the extra pulse to the even-numbered memory blocks.

Next, the flow of verify processing (third pattern) will be described with reference to the flowchart shown in FIG. 6. In the verify processing of the third pattern, first, the verify control circuit 28 applies a pulse corresponding to verify data to the memory cells of the even-numbered memory blocks BLK_0, BLK_2, ..., BLK_2n (step S21). The pulse corresponding to the verify data may be applied to the even-numbered memory blocks BLK_0, BLK_2, ..., BLK_2n in sequence, or may be applied to the even-numbered memory blocks BLK_0, BLK_2, . . . , BLK_2n at a time.

Then, the verify circuits VF_0 to VF_m perform the verify processing on the even-numbered memory blocks BLK_0, BLK_2, . . . , BLK_2n (step S22). More specifically, each verify circuit VF_0 to VF_m compares the verify data (erase verify data or write verify data) stored in the memory cell MC with the expectation value, and determines that the verify processing is normal (verify pass) when the verify data matches the expectation value. On the other hand, when the verify data does not match the expectation value, it is determined that the verify processing is abnormal (verify fail).

When it is determined that the verify processing is abnormal (verify fail) in at least one of the even-numbered memory blocks BLK_0, BLK_2, . . . , BLK_2n (step S23: No), steps S21 to S22 are repeated.

On the other hand, when it is determined that the verify processing is normal (verify pass) in all of the even-numbered memory blocks BLK_0, BLK_2, . . . , BLK_2n (step S23: Yes), the verify control circuit 28 applies the pulse corresponding to the verify data to the memory cells of the odd-numbered memory blocks BLK_1, BLK_3, . . . , BLK_2n+1 (step S24). The pulse corresponding to the verify data may be applied to the odd-numbered memory blocks BLK_1, BLK_3, . . . , BLK_2n+1 in sequence, or may be applied to the odd-numbered memory blocks BLK_1, BLK_3, . . . , BLK_2n+1 at a time.

Then, the verify circuits VF_0 to VF_m perform the verify processing on the odd-numbered memory blocks BLK_1, BLK_3, . . . , BLK_2n+1 (step S25). More specifically, each verify circuit VF_0 to VF_m compares the verify data (erase verify data or write verify data) stored in the memory cell MC with the expectation value, and determines that the verify processing is normal (verify pass) when the verify data matches the expectation value. On the other hand, when the verify data does not match the expectation value, it is determined that the verify processing is abnormal (verify fail).

When it is determined that the verify processing is abnormal (verify fail) in at least one of the odd-numbered memory blocks BLK_1, BLK_3, . . . , BLK_2n+1 (step S26: No), steps S24 to S25 are repeated.

On the other hand, when it is determined that the verify processing is normal (verify pass) in all of the odd-numbered memory blocks BLK_1, BLK_3, . . . , BLK_2n+1 (step S26: Yes), the verify processing of the semiconductor storage device is normal, and the verify processing is ended.

In the verify processing shown in FIGS. 4 and 5, the pulse corresponding to the verify data is applied to all the memory blocks BLK_0 to BLK_2n+1 (see step S1 in FIG. 4 and step S11 in FIG. 5). Therefore, even when it is determined that the verify processing is abnormal in either one of the even-numbered memory block and the odd-numbered memory block, the pulse is applied to all the memory blocks; consequently, the pulse is also applied to the memory block determined to be normal. On the other hand, in the verify processing shown in FIG. 6, the even-numbered memory block and the odd-numbered memory block are separately subjected to the pulse application and the verify processing. Therefore, it is possible to apply the pulse only to the memory block whose verify processing is determined to be abnormal among the even-numbered memory block and the odd-numbered memory block; consequently, it is possible to suppress the application of the extra pulse to each memory block.

Figure 6:
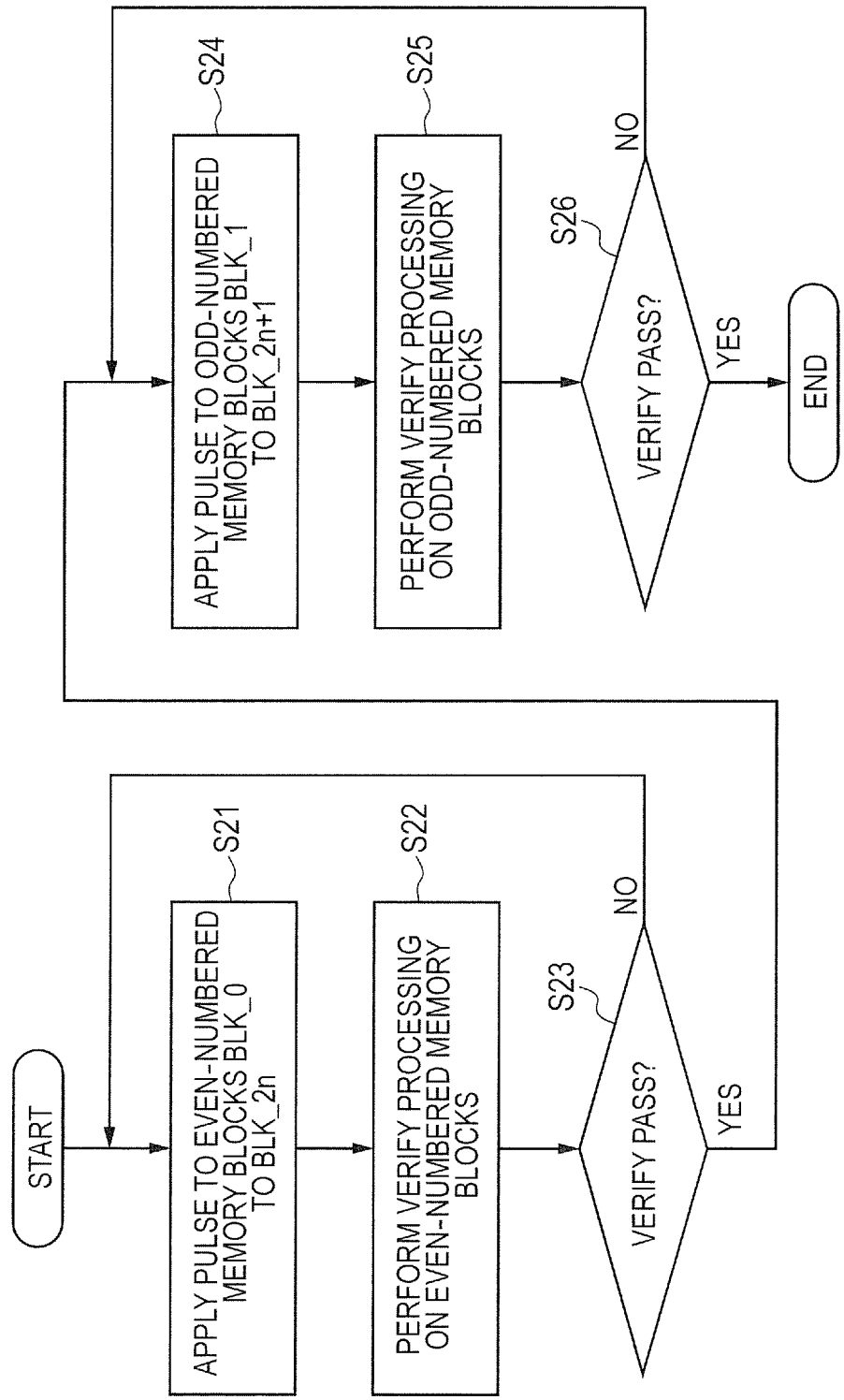
FIG. 6 is a flowchart for explaining an example of verify processing in the semiconductor storage device according to the first embodiment.

In the above-described verify processing shown in FIGS. 4 to 6, the verify processing is first performed on the even-numbered memory blocks BLK_0, BLK_2, . . . , BLK_2n, and then performed on the odd-numbered memory blocks BLK_1, BLK_3, . . . , BLK_2n+1. However, the verify processing may be performed in reverse order. That is, the verify processing may be first performed on the odd-numbered memory blocks BLK_1, BLK_3, . . . , BLK_2n+1, and then performed on the even-numbered memory blocks BLK_0, BLK_2, . . . , BLK_2n.

In the semiconductor storage device disclosed in Patent Document 1, one verify amplifier is provided separately from the sense amplifier. Further, the verify processing of each memory cell is performed using the one verify amplifier. The verify processing is performed in units of blocks; therefore, in the semiconductor storage device disclosed in Patent Document 1, the verify processing is performed in units of blocks in sequence (serially), using the one verify amplifier.

However, the memory capacity of the semiconductor storage device has been steadily increasing in recent years. Accordingly, in the case where the verify processing is performed in units of blocks in sequence (serially) as in the semiconductor storage device disclosed in Patent Document 1, there is a problem that much time is required for the verify processing.

Figure 13:
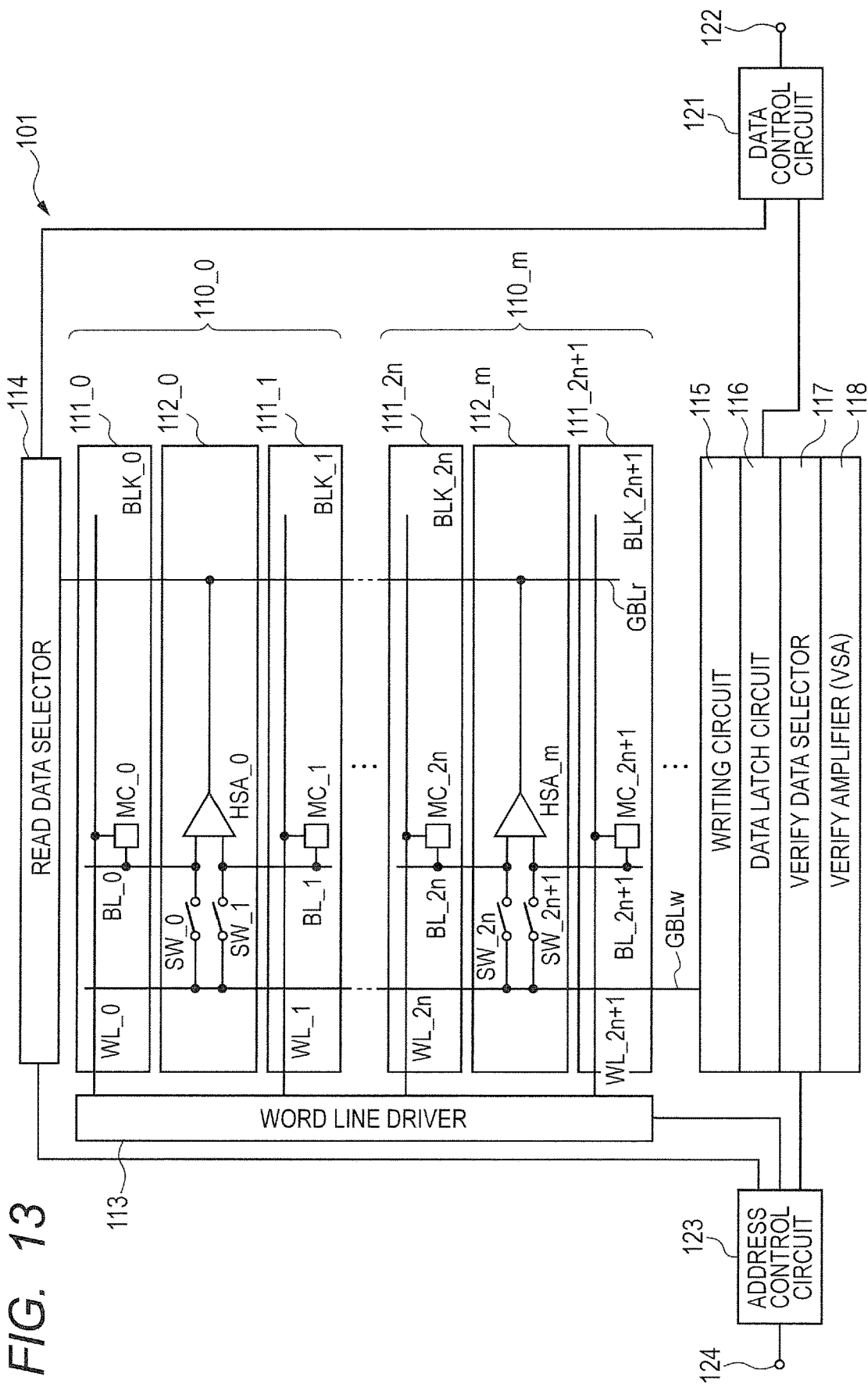
FIG. 13 is a diagram for explaining a semiconductor storage device according to a related art.

Hereinafter, the problem to be solved by the present application will be described in detail, using the semiconductor storage device according to the related art. FIG. 13 is a diagram for explaining the semiconductor storage device according to the related art. As shown in FIG. 13, the semiconductor storage device 101 according to the related art includes memory blocks 111_0 to 111_2n+1, sense amplifier blocks 112_0 to 112_m, a word line driver 113, a read data selector 114, a writing circuit 115, a data latch circuit 116, a verify data selector 117, a verify amplifier 118 (VSA), a data control circuit 121, a data input/output terminal 122, an address control circuit 123, and an address input terminal 124. The memory block pairs 111_0 and 111_1 to 111_2n and 111_2n+1 and the sense amplifier blocks 112_0 to 112_m configure unit memory arrays 110_0 to 110_m, respectively.

The memory blocks 111_0 to 111_2n+1, the sense amplifier blocks 112_0 to 112_m, the word line driver 113, the read data selector 114, the writing circuit 115, the data latch circuit 116, the data control circuit 121, the data input/output terminal 122, the address control circuit 123, and the address input terminal 124 included in the semiconductor storage device 101 according to the related art correspond to the memory blocks 11_0 to 11_2n+1, the sense amplifier blocks 12_0 to 12_m, the word line driver 13, the read data selector 14, the writing circuit 15, the data latch circuit 16, the data control circuit 21, the data input/output terminal 22, the address control circuit 23, and the address input terminal 24 included in the semiconductor storage device 1 shown in FIG. 2, respectively. Therefore, the operations other than the verify processing are the same as in the semiconductor storage device 1 shown in FIG. 2, and their description will not be repeated.

In the semiconductor storage device 101 according to the related art, when verify data is read from the memory cell MC of the memory block BLK, the sub-bit line BL of the memory cell MC is coupled to the main bit line GBLw through the use of the switch SW, so that the verify data of the memory cell MC is read through the main bit line GBLw. The read verify data is selected by the verify data selector 117, and then amplified by the verify amplifier (VSA) 118.

The amplified verify data is compared with an expectation value by an CPU (not shown), so that it is determined whether or not the verify processing is normal.

Figure 14:
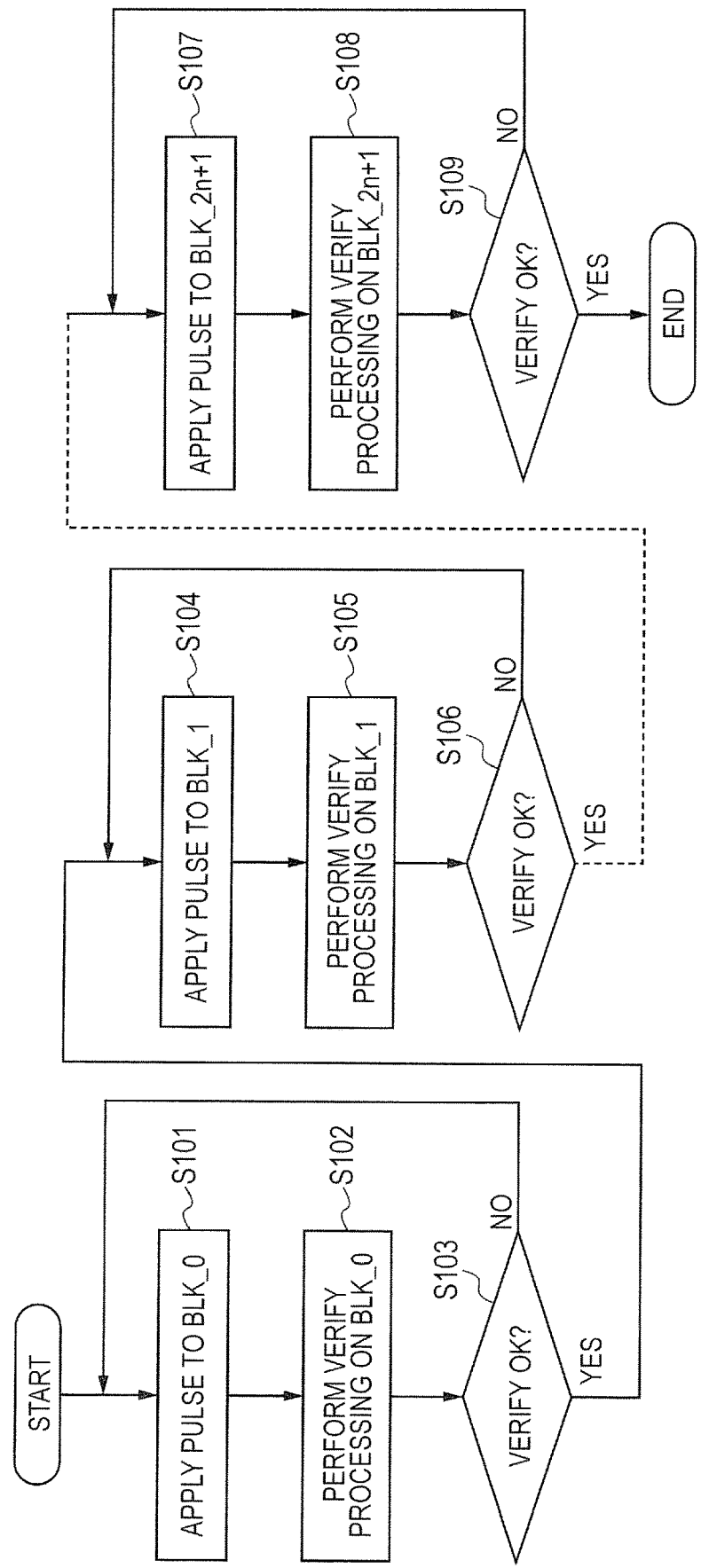
FIG. 14 is a flowchart for explaining verify processing in the semiconductor storage device according to the related art.

FIG. 14 is a flowchart for explaining the verify processing in the semiconductor storage device according to the related art. When the verify processing is performed in the semiconductor storage device 101 according to the related art, first, a pulse is applied to the memory block BLK_0, so that verify data is written to the memory cell MC_0 of the memory block BLK_0 (step S101). Then, the verify processing is performed on the memory block BLK_0 (step S102). More specifically, the switch SW_0 is turned on, and the sub-bit line BL_0 of the memory block BLK_0 is coupled to the main bit line GBLw, so that the verify data stored in the memory cell MC_0 is read through the main bit line GBLw. Then, the read verify data is amplified by the verify amplifier (VSA) 118, and the amplified verify data is compared with the expectation value, so that the verify processing is performed.

Then, when it is determined that the verify processing is abnormal (verify fail) (step S103: No), steps S101 to S102 are repeated. On the other hand, when it is determined that the verify processing is normal (verify pass) (step S103: Yes), the verify processing of the next memory block BLK_1 is performed.

That is, the pulse is applied to the memory block BLK_1, so that the verify data is written to the memory cell MC_1 of the memory block BLK_1 (step S104). Then, the verify processing is performed on the memory block BLK_1 (step S105). More specifically, the switch SW_1 is turned on, and the sub-bit line BL_1 of the memory block BLK_1 is coupled to the main bit line GBLw, so that the verify data stored in the memory cell MC_1 is read through the main bit line GBLw. Then, the read verify data is amplified by the verify amplifier (VSA) 118, and the amplified verify data is compared with the expectation value, so that the verify processing is performed.

Then, when it is determined that the verify processing is abnormal (verify fail) (step S106: No), steps S104 to S105 are repeated. On the other hand, when it is determined that the verify processing is normal (verify pass) (step S106: Yes), the verify processing of the next memory block BLK_2 is performed. Thereafter, the same operation is repeated, so that the verify processing of the memory blocks BLK_2 to BLK_2n+1 is performed. Then, when it is determined that the verify processing of the final-stage memory block BLK_2n+1 is normal (verify pass) (step S109: Yes), the verify processing of the semiconductor storage device 101 is normal, and the verify processing is ended.

Thus, in the semiconductor storage device 101 according to the related art, the verify amplifier (VSA) 118 is provided separately from the sense amplifiers HSA_0 to HSA_m. The verify processing of each memory block BLK_0 to BLK_2n+1 is performed using the verify amplifier (VSA) 118. Due to only one verify amplifier (VSA) 118, the verify processing of each memory block BLK_0 to BLK_2n+1 is performed in units of memory blocks BLK_0 to BLK_2n+1 in sequence (serially) (see FIG. 14).

However, since the memory capacity of the semiconductor storage device has been steadily increasing in recent years as described above; in the case where the verify processing is performed in units of memory blocks BLK_0 to BLK_2n+1 in sequence as in the semiconductor storage device 101 according to the related art, there is a problem that much time is required for the verify processing.

On the other hand, in the semiconductor storage device 1 according to this embodiment (see FIG. 2), the verify processing is performed using the sense amplifier HSA_0 to HSA_m included in each sense amplifier block 12_0 to 12_m. That is, since the multiple sense amplifiers HSA_0 to HSA_m are used for reading the verify data, the verify processing can be performed on the multiple memory blocks at the same time. Therefore, it is possible to reduce the time required for the verify processing of the semiconductor storage device.

Since the semiconductor storage device 1 according to this embodiment is supposed to perform the verify processing of the multiple memory blocks at a time, it is necessary to apply the same data to the memory cells of all the memory blocks subjected to the verify processing. For example, the write verify can be performed at the time of a test operation or the like for writing to all the memory cells at a time (e.g., at the time of writing a checker pattern). The erase verify can be performed in the case of erasing the flash memory in units of memory blocks.

Second Embodiment

Figure 7:
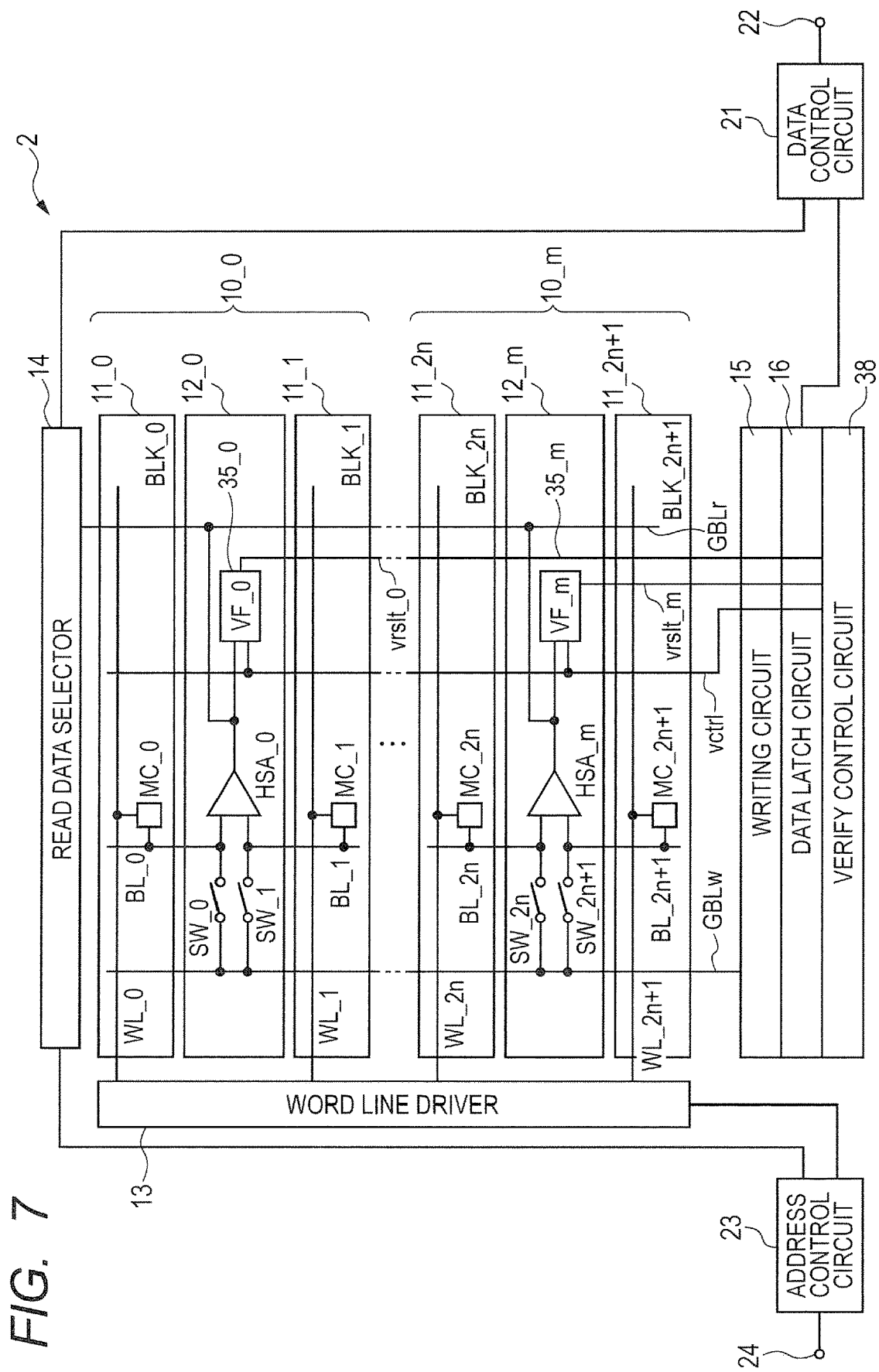
FIG. 7 is a diagram showing a semiconductor storage device according to a second embodiment.

Next, a semiconductor storage device and a method for controlling the semiconductor storage device according to a second embodiment will be described. FIG. 7 is a diagram showing the semiconductor storage device according to the second embodiment. The semiconductor storage device 2 according to this embodiment differs from the semiconductor storage device 1 (see FIG. 2) described in the first embodiment in that verify results vrslt_0 to vrslt_m of verify circuits VF_0 to VF_m (35_0 to 35_m) are each independently transmitted to a verify control circuit 38. Since the others are the same as in the semiconductor storage device 1 described in the first embodiment, the same constituent elements are denoted by the same reference numerals, and their description will not be repeated.

Figure 8:
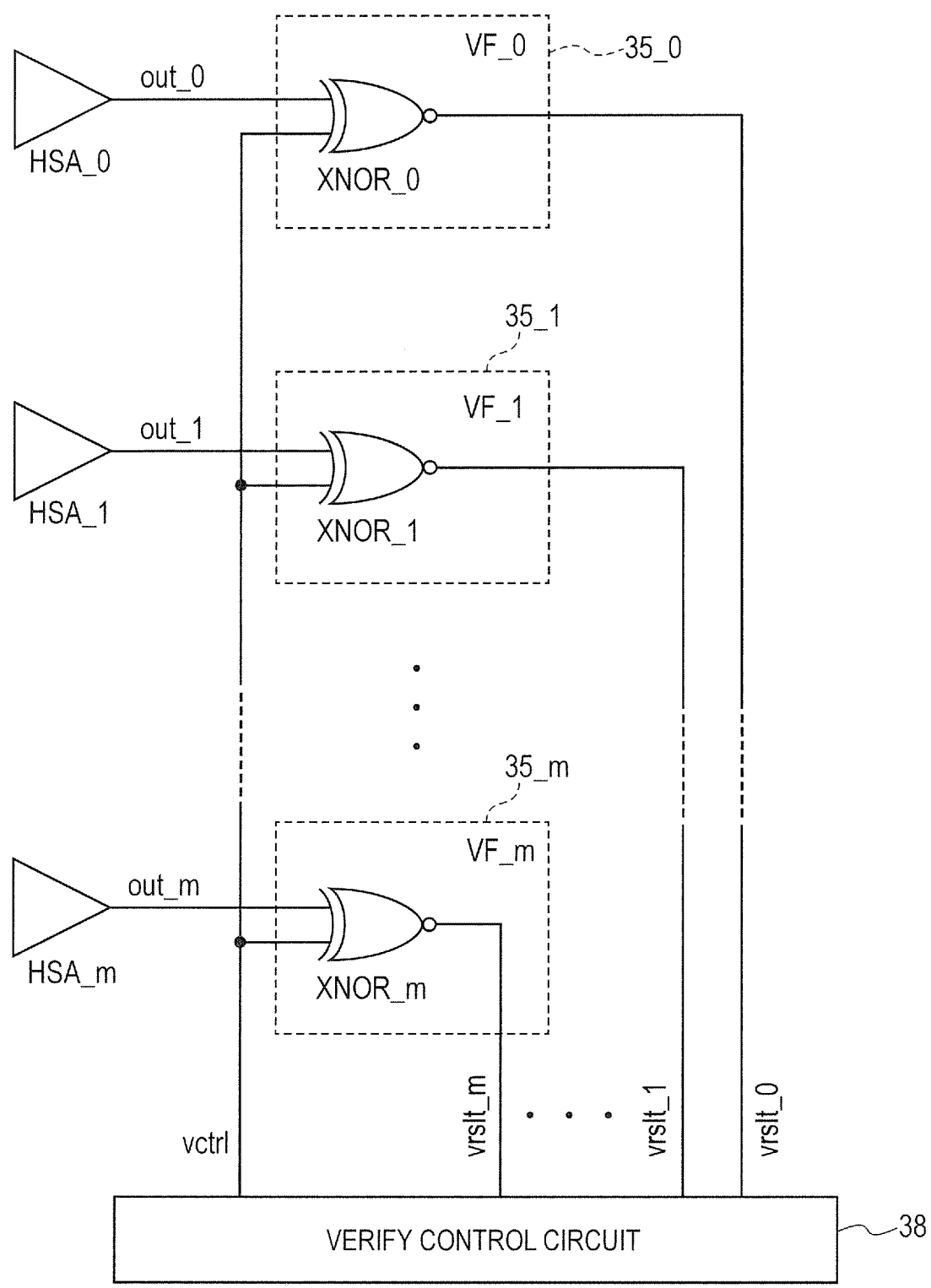
FIG. 8 is a circuit diagram showing an example of each verify circuit included in the semiconductor storage device according to the second embodiment.

As shown in FIG. 7, the verify results vrslt_0 to vrslt_m of the verify circuits VF_0 to VF_m (35_0 to 35_m) are each independently supplied to the verify control circuit 38. FIG. 8 is a circuit diagram showing an example of each verify circuit VF_0 to VF_m (35_0 to 35_m) included in the semiconductor storage device 2 according to this embodiment.

As shown in FIG. 8, the verify circuits VF_0 to VF_m include logic circuits XNOR_0 to XNOR_m, respectively. Each logic circuit XNOR_0 to XNOR_m compares the data of the memory cell read by each sense amplifier HSA_0 to HSA_m with the expectation value vctrl supplied from the verify control circuit 38, and outputs the comparison result as the verify result vrslt_0 to vrslt_m. That is, each logic circuit XNOR_0 to XNOR_m inputs the output out_0 to out_m of each sense amplifier HSA_0 to HSA_m and the expectation value vctrl supplied from the verify control circuit 38, and independently transmits each XNOR (negation of exclusive OR) to the verify control circuit 38. The expectation value vctrl supplied from the verify control circuit 38 is common to all the verify circuits VF_0 to VF_m.

Next, specific operations of each verify circuit VF_0 to VF_m (35_0 to 35_m) will be described. First, an operation in the case of the erase verify will be described. In the case of the erase verify, since the erase verify data is stored in the memory cell MC_0 to MC_2n+1 of each memory block BLK_0 to BLK_2n+1, the expectation value of the output of each sense amplifier HSA_0 to HSA_m is the high level ("H"). In this case, the verify control circuit 38 sets the high level ("H") as the expectation value vctrl to each verify circuit VF_0 to VF_m.

When the memory blocks subjected to the verify processing are normal, the output out_0 to out_m of each sense amplifier HSA_0 to HSA_m is at the high level ("H"), so that the signal of the high level ("H") is supplied to one input of each logic circuit XNOR_0 to XNOR_m. Further, since the signal of the high level ("H") as the expectation value vctrl is supplied to the other input of each logic circuit XNOR_0 to XNOR_m, each logic circuit XNOR_0 to XNOR_m independently transmits the signal of the high level ("H") (indicating "verify pass") as the verify result vrslt_0 to vrslt_m to the verify control circuit 38.

On the other hand, when the memory block subjected to the verify processing is abnormal, the output out_0 to out_m of the sense amplifier HSA_0 to HSA_m corresponding to the memory cell indicating abnormality is at the low level ("L"). In this case, since the output of the sense amplifier does not match the expectation value, the output of the logic circuit XNOR corresponding to the memory cell indicating abnormality among the outputs of the logic circuits XNOR_0 to XNOR_m is at the low level ("L": indicating "verify fail"). Since each verify result vrslt_0 to vrslt_m is independently supplied to the verify control circuit 38, the verify control circuit 38 can identify the memory block BLK indicating abnormality.

Next, an operation in the case of the write verify will be described. In the case of the write verify, since the write verify data is stored in the memory cell MC_0 to MC_2n+1 of each memory block BLK_0 to BLK_2n+1, the expectation value of the output of each sense amplifier HSA_0 to HSA_m is the low level ("L"). In this case, the verify control circuit 38 sets the low level ("L") as the expectation value vctrl to each verify circuit VF_0 to VF_m.

When the memory blocks subjected to the verify processing are normal, the output out_0 to out_m of each sense amplifier HSA_0 to HSA_m is at the low level ("L"), so that the signal of the low level ("L") is supplied to the one input of each logic circuit XNOR_0 to XNOR_m. Further, since the signal of the low level ("L") as the expectation value vctrl is supplied to the other input of each logic circuit XNOR_0 to XNOR_m, each logic circuit XNOR_0 to XNOR_m independently transmits the signal of the high level ("H") (indicating "verify pass") as the verify result vrslt_0 to vrslt_m to the verify control circuit 38.

On the other hand, when the memory block subjected to the verify processing is abnormal, the output out_0 to out_m of the sense amplifier HSA_0 to HSA_m corresponding to the memory cell indicating abnormality is at the high level ("H"). In this case, since the output of the sense amplifier does not match the expectation value, the output of the logic circuit XNOR corresponding to the memory cell indicating abnormality among the outputs of the logic circuits XNOR_0 to XNOR_m is at the low level ("L": indicating "verify fail"). Since each verify result vrslt_0 to vrslt_m is independently supplied to the verify control circuit 38, the verify control circuit 38 can identify the memory block BLK indicating abnormality.

For example, the verify control circuit 38 includes flag areas corresponding to the memory blocks BLK_0 to BLK_2n+1. When the result of the verify processing is normal, the flag of the memory block BLK whose result of the verify processing is normal is set to "1" (indicating "verify pass"). On the other hand, when the result of the verify processing is abnormal, the flag of the memory block BLK whose result of the verify processing is abnormal is set to "0" (indicating "verify fail"). The verify control circuit 38 can distinguish between the memory block BLK whose result of the verify processing is normal and the memory block BLK whose result of the verify processing is abnormal, using the flag.

Next, the flow of the verify processing in the semiconductor storage device 2 according to this embodiment (the method for controlling the semiconductor storage device) will be described with reference to a flowchart shown in FIG. 9. The flow of the verify processing described below is common to the erase verify and the write verify.

Figure 9:
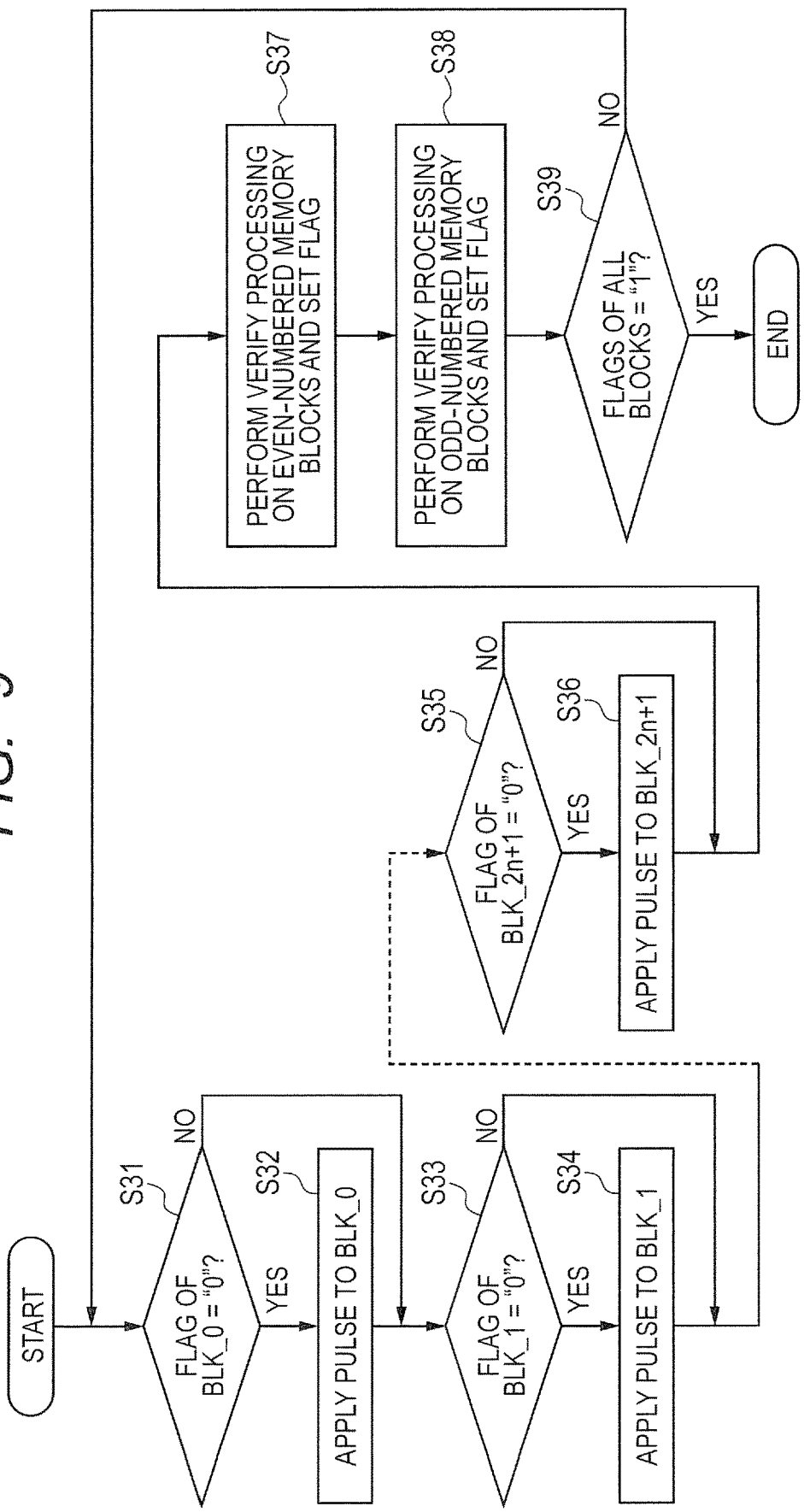
FIG. 9 is a flowchart for explaining an example of verify processing in the semiconductor storage device according to the second embodiment.

As shown in FIG. 9, first, the verify control circuit 38 determines whether or not the flag of the memory block BLK_0 is "0" (indicating "verify fail"). In the first flow, a pulse corresponding to verify data has not yet been applied to the memory block BLK_0; therefore, the flag of the memory block BLK_0 is "0" (step S31: Yes). Accordingly, the verify control circuit 38 applies the pulse corresponding to the verify data to the memory block BLK_0 (step S32).

Next, the verify control circuit 38 determines whether or not the flag of the memory block BLK_1 is "0" (indicating "verify fail"). In the first flow, the pulse corresponding to the verify data has not yet been applied to the memory block BLK_1; therefore, the flag of the memory block BLK_1 is "0" (step S33: Yes). Accordingly, the verify control circuit 38 applies the pulse corresponding to the verify data to the memory block BLK_1 (step S34).

Thereafter, in the same way, the verify control circuit 38 determines whether or not the flag of the memory block BLK_2 to BLK_2n+1 is "0" (indicating "verify fail") as well. In the first flow, the pulse corresponding to the verify data has not yet been applied to the memory block BLK_2 to BLK_2n+1; therefore, the flag of the memory block BLK_2 to BLK_2n+1 is "0". Accordingly, the verify control circuit 38 applies the pulse corresponding to the verify data to the memory block BLK_2 to BLK_2n+1. By this operation, the pulse corresponding to the verify data is applied to each memory block BLK_0 to BLK_2n+1.

Then, the verify circuits VF_0 to VF_m perform the verify processing on the even-numbered memory blocks BLK_0, BLK_2, ..., BLK_2n. Further, the verify control circuit 38 sets the flag in accordance with the result of the verify processing (step S37). More specifically, each verify circuit VF_0 to VF_m compares the verify data (erase verify data or write verify data) stored in the memory cell MC with the expectation value, and determines that the verify processing is normal (verify pass) when the verify data matches the expectation value. On the other hand, when the verify data does not match the expectation value, it is determined that the verify processing is abnormal (verify fail).

When the verify processing is normal, each verify circuit VF_0 to VF_m transmits the signal indicating "verify pass" as the verify result vrslt_0 to vrslt_m to the verify control circuit 38. On the other hand, when the verify processing is abnormal, each verify circuit VF_0 to VF_m transmits the signal indicating "verify fail" as the verify result vrslt_0 to vrslt_m to the verify control circuit 38.

The verify control circuit 38 rewrites the flag of each memory block BLK_0 to BLK_2n+1 in accordance with the verify result vrslt_0 to vrslt_m. More specifically, when the result of the verify processing is normal, the verify control circuit 38 sets the flag of the memory block BLK whose result of the verify processing is normal to "1" (indicating "verify pass"). On the other hand, when the result of the verify processing is abnormal, the verify control circuit 38 sets the flag of the memory block BLK whose result of the verify processing is abnormal to "0" (indicating "verify fail").

Next, the verify circuits VF_0 to VF_m perform the verify processing on the odd-numbered memory blocks BLK_1, BLK_3, ..., BLK_2n+1. Further, the verify control circuit 38 sets the flag in accordance with the result of the verify processing (step S38). Since step S38 is similar to step S37, the description will not be repeated.

Then, the verify control circuit 38 determines whether or not the flags of all the memory blocks BLK_0 to BLK_2n+1 are "1" (indicating "verify pass"). When the flags of all the memory blocks BLK_0 to BLK_2n+1 are "1" (indicating "verify pass") (step S39: Yes), the verify processing of the semiconductor storage device 2 is normal, and the verify processing is ended. On the other hand, when the flags of the memory blocks BLK_0 to BLK_2n+1 include "0" (indicating "verify fail") (step S39: No), step S31 and subsequent steps are repeated.

For example, when the flag of the memory block BLK_0 is "1" (indicating "verify pass") (step S31: No), the flow moves to step S33 without applying the pulse to the memory block BLK_0. Further, for example, when the flag of the memory block BLK_1 is "0" (indicating "verify fail") (step S33: Yes), the pulse is again applied to the memory block BLK_1 (step S34). That is, in steps S31 to S36 for the second and subsequent times, the pulse is again applied to the memory block BLK whose flag is "0" (indicating "verify fail").

Then, the verify circuits VF_0 to VF_m perform the verify processing on the even-numbered memory blocks BLK_0, BLK_2, ..., BLK_2n. Further, the verify control circuit 38 sets the flag in accordance with the result of the verify processing (step S37).

Similarly, the verify circuits VF_0 to VF_m perform the verify processing on the odd-numbered memory blocks BLK_1, BLK_3, ..., BLK_2n+1. Further, the verify control circuit 38 sets the flag in accordance with the result of the verify processing (step S38).

Then, the verify control circuit 38 determines whether or not the flags of all the memory blocks BLK_0 to BLK_2n+1 are "1" (indicating "verify pass"). When the flags of all the memory blocks BLK_0 to BLK_2n+1 are "1" (indicating "verify pass") (step S39: Yes), the verify processing of the semiconductor storage device 2 is normal, and the verify processing is ended. On the other hand, when the flags of the memory blocks BLK_0 to BLK_2n+1 include "0" (indicating "verify fail") (step S39: No), step S31 and subsequent steps are repeated.

The semiconductor storage device 2 according to this embodiment is configured so that the verify results vrslt_0 to vrslt_m of the verify circuits VF_0 to VF_m (35_0 to 35_m) are each independently transmitted to the verify control circuit 38. Therefore, it is possible to individually determine the result of the verify processing of each memory block BLK_0 to BLK_2n+1. Thereby, when the pulse is again applied to the memory block, it is possible to selectively apply the pulse only to the memory block of "verify fail". Therefore, it is possible to avoid unnecessary pulse application to the memory block and therefore to suppress the deterioration of the memory cell. Further, it is possible to reduce a pulse application time and therefore to reduce a verify processing time and suppress a test cost.

Third Embodiment

Figure 10:
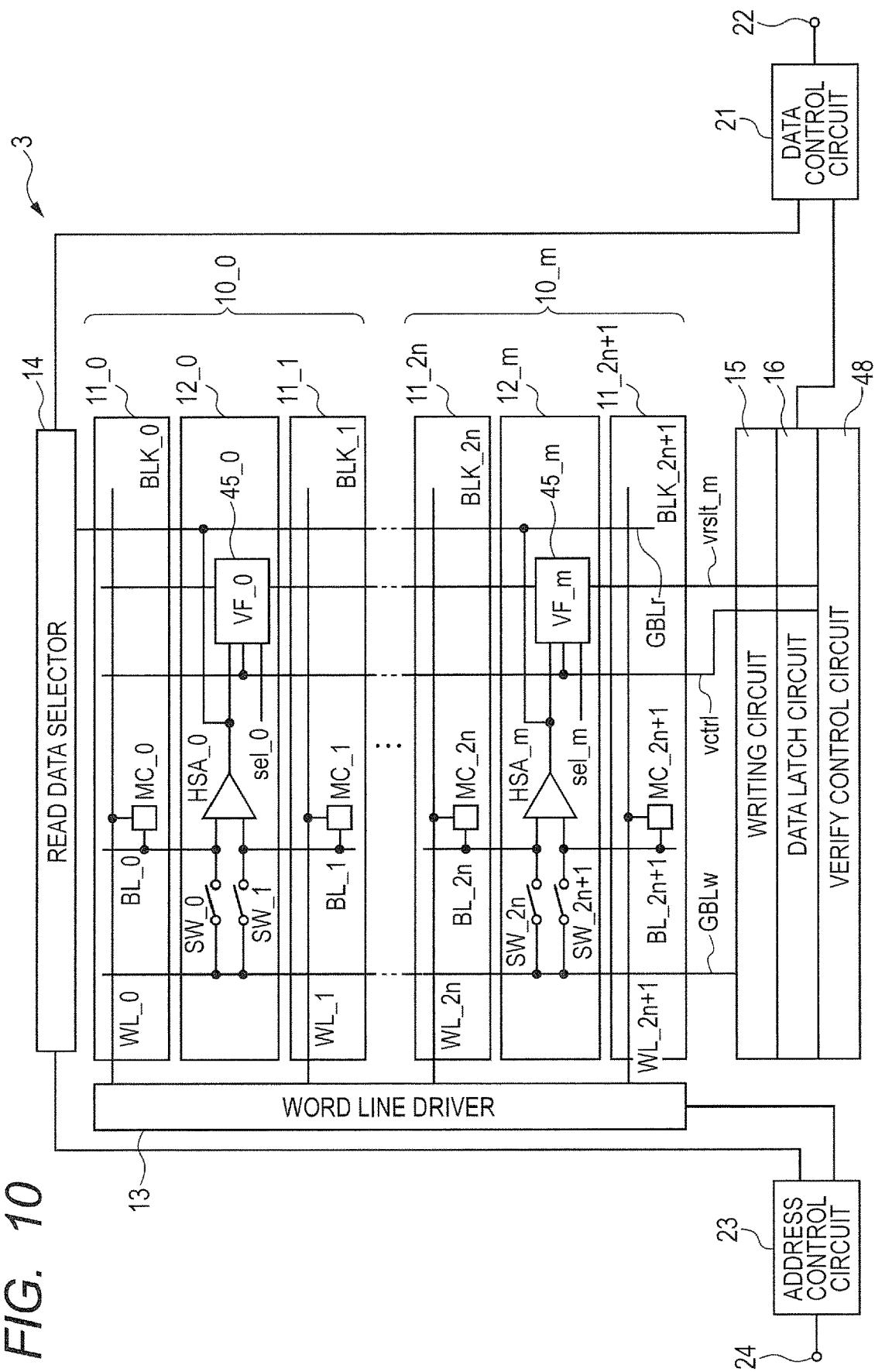
FIG. 10 is a diagram showing a semiconductor storage device according to a third embodiment.

Next, a semiconductor storage device and a method for controlling the semiconductor storage device according to a third embodiment will be described. FIG. 10 is a diagram showing the semiconductor storage device according to the third embodiment. The semiconductor storage device 3 according to this embodiment differs from the semiconductor storage device 1 (see FIG. 2) described in the first embodiment in that verify results vrslt_0 to vrslt_m of verify circuits VF_0 to VF_m (45_0 to 45_m) are transmitted to a verify control circuit 48 in time division. Since the others are the same as in the semiconductor storage device 1 described in the first embodiment, the same constituent elements are denoted by the same reference numerals, and their description will not be repeated.

As shown in FIG. 10, each selection signal sel_0 to sel_m is supplied to each verify circuit VF_0 to VF_m (45_0 to 45_m). Each verify circuit VF_0 to VF_m (45_0 to 45_m) transmits the verify result vrslt_0 to vrslt_m to the verify control circuit 48 at a timing when the selection signal sel_0 to sel_m is activated.

Figure 11:
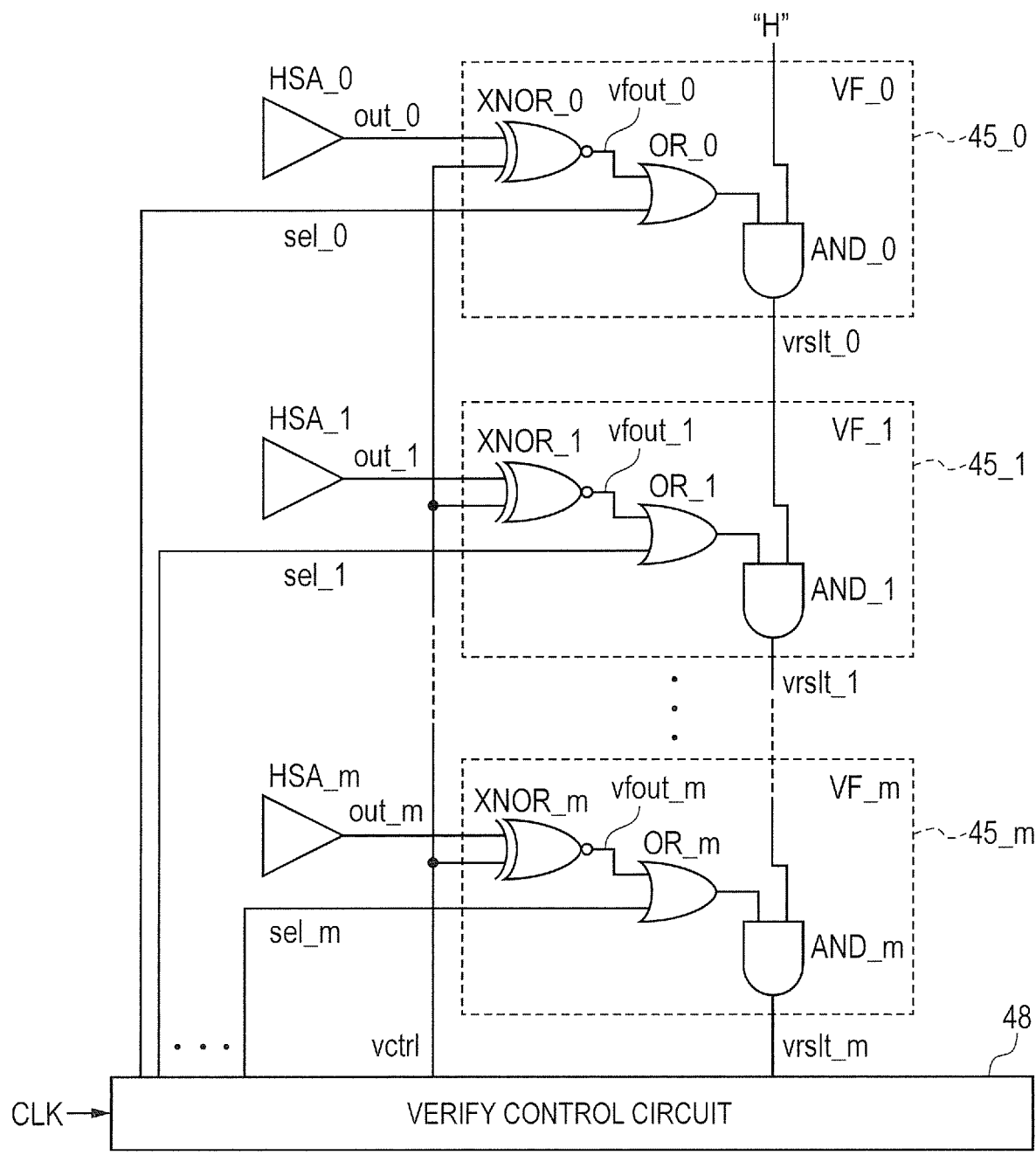
FIG. 11 is a circuit diagram showing an example of each verify circuit included in the semiconductor storage device according to the third embodiment.

FIG. 11 is a circuit diagram showing an example of each verify circuit VF_0 to VF_m (45_0 to 45_m) included in the semiconductor storage device 3 according to this embodiment. As shown in FIG. 11, the verify circuits VF_0 to VF_m (45_0 to 45_m) include logic circuits XNOR_0 to XNOR_m, logic circuits OR_0 to OR_m, and logic circuits AND_0 to AND_m, respectively. Further, a clock signal CLK is supplied to the verify control circuit 48.

Each logic circuit XNOR_0 to XNOR_m compares the verify data of the memory cell read by each sense amplifier HSA_0 to HSA_m with the expectation value vctrl supplied from the verify control circuit 48, and outputs the comparison result as the result of the verify processing. That is, each logic circuit XNOR_0 to XNOR_m inputs the output out_0 to out_m of each sense amplifier HSA_0 to HSA_m and the expectation value vctrl supplied from the verify control circuit 48, and supplies the XNOR (negation of exclusive OR) to one input of each logic circuit OR_0 to OR_m. The expectation value vctrl supplied from the verify control circuit 48 is common to all the verify circuits VF_0 to VF_m.

For example, in the case of the erase verify, since the erase verify data is stored in the memory cell MC_0 to MC_2n+1 of each memory block BLK_0 to BLK_2n+1, the expectation value of the output of each sense amplifier HSA_0 to HSA_m is the high level ("H"). In this case, the verify control circuit 48 sets the high level ("H") as the expectation value vctrl to each verify circuit VF_0 to VF_m.

When the memory cell subjected to the verify processing is normal, the output of the sense amplifier HSA_0 to HSA_m is at the high level ("H"), so that the signal of the high level ("H") is supplied to one input of the logic circuit XNOR_0 to XNOR_m. Further, since the signal of the high level ("H") as the expectation value vctrl is supplied to the other input of each logic circuit XNOR_0 to XNOR_m, the logic circuit XNOR_0 to XNOR_m supplies the signal vfout_0 to vfout_m of the high level ("H") to the one input of each logic circuit OR_0 to OR_m.

On the other hand, when the memory cell subjected to the verify processing is abnormal, the output of the sense amplifier HSA_0 to HSA_m is at the low level ("L"). In this case, since the output of the sense amplifier does not match the expectation value, the output of the logic circuit XNOR_0 to XNOR_m is at the low level ("L"). Therefore, the logic circuit XNOR_0 to XNOR_m supplies the signal vfout_0 to vfout_m of the low level ("L") as the result of the verify processing to the one input of each logic circuit OR_0 to OR_m.

In the case of the write verify, since the write verify data is stored in the memory cell MC_0 to MC_2n+1 of each memory block BLK_0 to BLK_2n+1, the expectation value of the output of each sense amplifier HSA_0 to HSA_m is the low level ("L"). In this case, the verify control circuit 48 sets the low level ("L") as the expectation value vctrl to each verify circuit VF_0 to VF_m.

When the memory cell subjected to the verify processing is normal, the output of the sense amplifier HSA_0 to HSA_m is at the low level ("L"), so that the signal of the low level ("L") is supplied to the one input of the logic circuit XNOR_0 to XNOR_m. Further, since the signal of the low level ("L") as the expectation value vctrl is supplied to the other input of each logic circuit XNOR_0 to XNOR_m, the logic circuit XNOR_0 to XNOR_m supplies the signal vfout_0 to vfout_m of the high level ("H") as the result of the verify processing to the one input of each logic circuit OR_0 to OR_m.

On the other hand, when the memory cell subjected to the verify processing is abnormal, the output of the sense amplifier HSA_0 to HSA_m is at the high level ("H"). In this case, since the output of the sense amplifier does not match the expectation value, the output of the logic circuit XNOR_0 to XNOR_m is at the low level ("L"). Therefore, the logic circuit XNOR_0 to XNOR_m supplies the signal vfout_0 to vfout_m of the low level ("L") as the result of the verify processing to the one input of each logic circuit OR_0 to OR_m.

The selection signal sel_0 to sel_m is supplied from the verify control circuit 48 to the other input of each logic circuit OR_0 to OR_m. When the selection signal sel_0 to sel_m is in an active state (at the low level "L"), each logic circuit OR_0 to OR_m outputs the output vfout_0 to vfout_m (the result of the verify processing) of each logic circuit XNOR_0 to XNOR_m to one input of each logic circuit AND_0 to AND_m.

On the other hand, when the selection signal sel_0 to sel_m is in an inactive state (at the high level "H"), each logic circuit OR_0 to OR_m outputs the signal of the high level ("H") to the one input of each logic circuit AND_0 to AND_m, regardless of the output vfout_0 to vfout_m (the result of the verify processing) of each logic circuit XNOR_0 to XNOR_m. In other words, when the selection signal sel_0 to sel_m is in the inactive state (at the high level "H"), each logic circuit OR_0 to OR_m masks the output vfout_0 to vfout_m (the result of the verify processing) of each logic circuit XNOR_0 to XNOR_m.

Each logic circuit AND_0 to AND_m inputs the output of each logic circuit OR_0 to OR_m and the verify result in the preceding stage (since the verify circuit 45_0 is the first-stage circuit, "H" is set as an initial value), outputs the verify result in the preceding stage when the selection signal is in the inactive state, and outputs the output vfout_0 to vfout_m of the logic circuit XNOR_0 to XNOR_m supplied from each logic circuit OR_0 to OR_m when the selection signal sel_0 to sel_m is in the active state.

That is, when the selection signal sel_0 to sel_m is in the inactive state (at the high level "H"), each logic circuit OR_0 to OR_m outputs the signal of the high level ("H") to the one input of each logic circuit AND_0 to AND_m. In this case, each logic circuit AND_0 to AND_m does not consider the result of the verify processing in the preceding stage.

On the other hand, when the selection signal sel_0 to sel_m is in the active state (at the low level "L"), each logic circuit OR_0 to OR_m outputs the output vfout_0 to vfout_m of each logic circuit XNOR_0 to XNOR_m to the one input of each logic circuit AND_0 to AND_m. Since the signal of the high level ("H") is supplied from the preceding stage to the other input of each logic circuit AND_0 to AND_m, each logic circuit AND_0 to AND_m outputs the output vfout_0 to vfout_m of the logic circuit XNOR_0 to XNOR_m supplied from each logic circuit OR_0 to OR_m.

Figure 12:
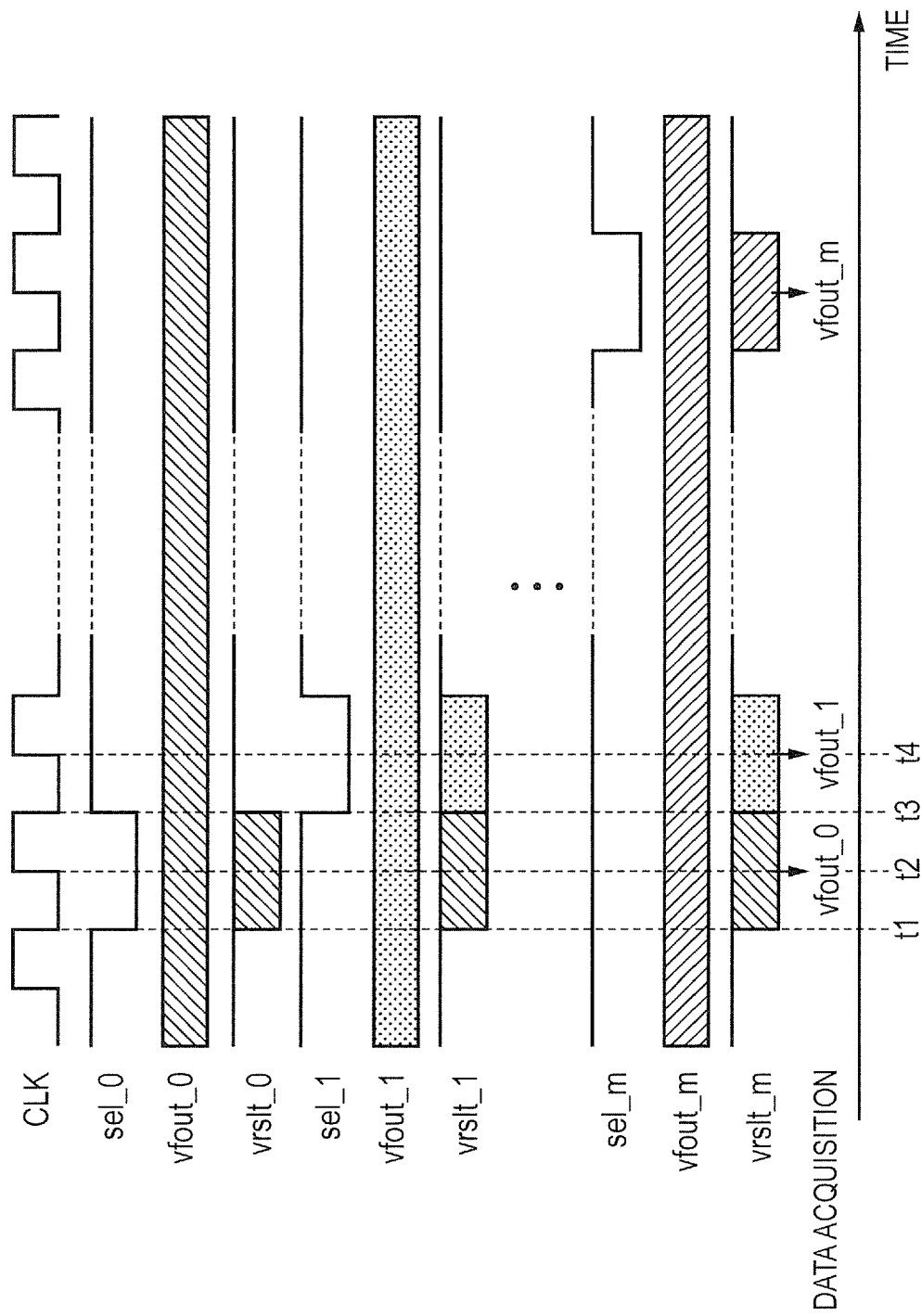
FIG. 12 is a timing chart for explaining verify processing in the semiconductor storage device according to the third embodiment.

Next, the operation of the verify circuit VF_0 to VF_m (45_0 to 45_m) will be described with reference to a timing chart shown in FIG. 12. As shown in FIG. 12, each selection signal sel_0 to sel_m transitions in synchronization with the clock signal CLK. Further, each logic circuit XNOR_0 to XNOR_m outputs the result vfout_0 to vfout_m of the verify processing. In an initial state, each selection signal sel_0 to sel_m is in the inactive state (at the high level "H").

When the selection signal sel_0 becomes the active state (the low level "L") at a timing t1, the logic circuit OR_0 of the verify circuit VF_0 shown in FIG. 11 outputs the output vfout_0 (the result of the verify processing) of the logic circuit XNOR_0 to the one input of the logic circuit AND_0. Since the signal of the high level ("H") is supplied to the other input of the logic circuit AND_0, the logic circuit AND_0 outputs the output vfout_0 of the logic circuit XNOR_0 supplied from the logic circuit OR_0, as the verify result vrslt_0.

Since the selection signal sel_1 to sel_m in the inactive state (of the high level "H") is supplied to the subsequent-stage verify circuit VF_1 to VF_m, the logic circuit AND_1 to AND_m of the subsequent-stage verify circuit VF_1 to VF_m delivers the verify result vrslt_0 of the verify circuit VF_0 to the subsequent stage. Then, at a timing t2, the verify control circuit 48 acquires the output vrslt_m of the logic circuit AND_m, that is, the verify result vfout_0 transmitted from the verify circuit VF_0.

Then, when the selection signal sel_0 becomes the inactive state (the high level "H") and the selection signal sel_1 becomes the active state (the low level "L") at a timing t3, the logic circuit OR_0 of the verify circuit VF_0 shown in FIG. 11 outputs the signal of the high level ("H") to the one input of the logic circuit AND_0. Therefore, the logic circuit AND_0 outputs the signal vrslt_0 of the high level ("H"). Further, the logic circuit OR_1 of the verify circuit VF_1 outputs the output vfout_1 (the result of the verify processing) of the logic circuit XNOR_1 to the one input of the logic circuit AND_1. Since the signal of the high level ("H") is supplied to the other input of the logic circuit AND_1, the logic circuit AND_1 outputs the output vfout_1 of the logic circuit XNOR_1 supplied from the logic circuit OR_1, as the verify result vrslt_1.

Since the selection signal sel_2 to sel_m in the inactive state (of the high level "H") is supplied to the subsequent-stage verify circuit VF_2 to VF_m, the logic circuit AND_2 to AND_m of the subsequent-stage verify circuit VF_2 to VF_m delivers the verify result vrslt_1 of the verify circuit VF_1 to the subsequent stage. Then, at a timing t4, the verify control circuit 48 acquires the output vrslt_m of the logic circuit AND_m, that is, the verify result vfout_1 transmitted from the verify circuit VF_1.

Thereafter, the same operation is repeated, so that the result vfout_2 to vfout_m of the verify processing of the verify circuit VF_2 to VF_m is acquired in time division.

In the semiconductor storage device 2 described in the second embodiment, since the verify results vrslt_0 to vrslt_m of the verify circuits VF_0 to VF_m are each independently transmitted to the verify control circuit 38, it is necessary to dispose wiring lines whose number is the same as that of the verify circuits VF_0 to VF_m in the bit line direction. Accordingly, the degree of freedom of layout might be restricted.

On the other hand, in the semiconductor storage device 3 according to this embodiment, the verify circuits VF_0 to VF_m are sequentially coupled to each other, as in the semiconductor storage device 1 according to the first embodiment. Further, the verify results vrslt_0 to vrslt_m of the verify circuits VF_0 to VF_m are transmitted to the verify control circuit 48 in time division. Therefore, it is possible to individually determine the result of the verify processing of each memory block BLK_0 to BLK_2$n$+1 while suppressing the restriction on the degree of freedom of layout.

While the invention made above by the present inventors has been described specifically based on the illustrated embodiments, the present invention is not limited thereto. It is needless to say that various changes and modifications can be made thereto without departing from the spirit and scope of the invention.

What is claimed is:

1. A semiconductor storage device comprising:
a plurality of unit memory arrays each including a plurality of memory blocks each including a plurality of memory cells, a sense amplifier for reading data stored in each memory cell, and a verify circuit for verifying data stored in each memory cell; and
a verify control circuit for controlling verify processing in each verify circuit,
wherein the verify control circuit applies a pulse corresponding to verify data to each memory cell of each memory block, and sets an expectation value corresponding to the verify data to each verify circuit,
wherein each verify circuit performs the verify processing by comparing the data stored in the memory cell and read by the sense amplifier with the expectation value, and
wherein each verify circuit is configured to sequentially transmit a result of the verify processing in each verify circuit to the verify control circuit.

2. The semiconductor storage device according to claim 1, wherein the memory blocks which the unit memory arrays each include are first and second memory blocks, and
wherein the sense amplifier and the verify circuit are disposed between the first memory block and the second memory block.

3. The semiconductor storage device according to claim 2, wherein each verify circuit performs the verify processing of the first memory block, and then performs the verify processing of the second memory block.

4. The semiconductor storage device according to claim 2, wherein the verify control circuit applies the pulse corresponding to the verify data to memory cells of the first and second memory blocks,
wherein each verify circuit performs the verify processing of the first memory block, and
wherein when the first memory block is determined to be normal in the verify processing, each verify circuit performs the verify processing of the second memory block.

5. The semiconductor storage device according to claim 2, wherein after the verify control circuit applies the pulse corresponding to the verify data to the memory cell of the first memory block, each verify circuit performs the verify processing of the first memory block, and
wherein when the first memory block is determined to be normal in the verify processing, each verify circuit performs the verify processing of the second memory block after the verify control circuit applies the pulse corresponding to the verify data to the memory cell of the second memory block.

6. The semiconductor storage device according to claim 1, wherein each verify circuit includes:

a first logic circuit which compares the data stored in the memory cell and read by the sense amplifier with the expectation value, and outputs a comparison result as the result of the verify processing; and
a second logic circuit which inputs an output of the first logic circuit and the result of the verify processing in a preceding stage, and outputs a signal indicating normality when the output of the first logic circuit and the result of the verify processing in the preceding stage are both normal.

7. A semiconductor storage device comprising:
a plurality of unit memory arrays each including a plurality of memory blocks each including a plurality of memory cells, a sense amplifier for reading data stored in each memory cell, and a verify circuit for verifying data stored in each memory cell; and
a verify control circuit for controlling verify processing in each verify circuit,
wherein the verify control circuit applies a pulse corresponding to verify data to each memory cell of each memory block, and sets an expectation value corresponding to the verify data to each verify circuit,
wherein each verify circuit performs the verify processing by comparing the data stored in the memory cell and read by the sense amplifier with the expectation value, and
wherein each verify circuit is configured to independently transmit each result of the verify processing in each verify circuit to the verify control circuit.

8. The semiconductor storage device according to claim 7, wherein each verify circuit includes a third logic circuit which compares the data stored in the memory cell and read by the sense amplifier with the expectation value, and outputs a comparison result as the result of the verify processing to the verify control circuit.

9. A semiconductor storage device comprising:
a plurality of unit memory arrays each including a plurality of memory blocks each including a plurality of memory cells, a sense amplifier for reading data stored in each memory cell, and a verify circuit for verifying data stored in each memory cell; and
a verify control circuit for controlling verify processing in each verify circuit,
wherein the verify control circuit applies a pulse corresponding to verify data to each memory cell of each memory block, and sets an expectation value corresponding to the verify data to each verify circuit,
wherein each verify circuit performs the verify processing by comparing the data stored in the memory cell and read by the sense amplifier with the expectation value,
wherein the verify control circuit is configured to supply a selection signal to each verify circuit in time division,
wherein each verify circuit transmits a result of the verify processing in the verify circuit to the verify control circuit at a timing when the selection signal is activated, and
wherein each verify circuit includes:
a first logic circuit which compares the data stored in the memory cell and read by the sense amplifier with the expectation value, and outputs a comparison result as the result of the verify processing;
a second logic circuit which outputs the result of the verify processing outputted from the first logic circuit when the selection signal is in an active state; and
a third logic circuit which inputs an output of the second logic circuit and the result of the verify processing in a preceding stage, outputs the result of the verify processing in the preceding stage when the selection signal is in an inactive state, and outputs the result of the verify processing outputted from the second logic circuit when the selection signal is in the active state.

* * * * *